(12) United States Patent
Wang et al.

(10) Patent No.: US 12,426,241 B2
(45) Date of Patent: Sep. 23, 2025

(54) SEMICONDUCTOR STRUCTURE AND MANUFACTURING METHOD THEREOF, MEMORY CHIP AND ELECTRONIC DEVICE

(71) Applicant: CHANGXIN MEMORY TECHNOLOGIES, INC., Hefei (CN)

(72) Inventors: Hong Wang, Hefei (CN); Xiaojie Li, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 419 days.

(21) Appl. No.: 18/154,930

(22) Filed: Jan. 16, 2023

(65) Prior Publication Data
US 2023/0413515 A1    Dec. 21, 2023

Related U.S. Application Data

(63) Continuation of application No. PCT/CN2022/109526, filed on Aug. 1, 2022.

(30) Foreign Application Priority Data

Jun. 21, 2022   (CN) .......................... 202210709274.2

(51) Int. Cl.
H10B 12/00    (2023.01)
(52) U.S. Cl.
CPC ............. *H10B 12/30* (2023.02); *H10B 12/02* (2023.02)
(58) Field of Classification Search
CPC ..... H10B 12/30; H10B 12/482; H10B 12/488
See application file for complete search history.

(56) References Cited

U.S. PATENT DOCUMENTS 10,784,272 B2    9/2020   Lee
10,910,378 B2    2/2021   Lee et al.
(Continued)

FOREIGN PATENT DOCUMENTS

CN    105990366 A    10/2016
CN    106959783 A     7/2017
(Continued)

OTHER PUBLICATIONS

JP first office action in application No. 2023-501257, mailed on Aug. 6, 2024.
(Continued)

*Primary Examiner* — Evren Seven
(74) *Attorney, Agent, or Firm* — SYNCODA LLC; Feng Ma

(57) ABSTRACT

A semiconductor structure comprises a substrate, wherein the substrate is provided with a stacked structure, the stacked structure comprising a plurality of memory cell groups arranged in a first direction, each of the memory cell groups comprising multiple layers of memory cells arranged in a second direction, the stacked structure further comprising a plurality of horizontal signal lines arranged in the second direction, wherein each of the horizontal signal lines is in contact with one layer of the memory cells; and a plurality of leading wire posts arranged in the first direction, wherein the plurality of leading wire posts and the plurality of horizontal signal lines are arranged along a third direction, and the leading wire posts are connected to the horizontal signal lines.

20 Claims, 21 Drawing Sheets

(56) References Cited

U.S. PATENT DOCUMENTS

| | | | |
|---|---|---|---|
| 11,133,465 | B2 | 9/2021 | Liu |
| 11,355,509 | B2 | 6/2022 | Lee |
| 11,393,820 | B2 | 7/2022 | Lee |
| 2012/0182804 | A1 | 7/2012 | Hung et al. |
| 2012/0281471 | A1 | 11/2012 | Hung et al. |
| 2013/0235674 | A1 | 9/2013 | Hung et al. |
| 2016/0005481 | A1 | 1/2016 | Hung et al. |
| 2019/0164985 | A1* | 5/2019 | Lee .................. H10D 1/714 |
| 2020/0279601 | A1* | 9/2020 | Kim .................. G11C 11/4097 |
| 2020/0388625 | A1 | 12/2020 | Lee et al. |
| 2021/0111342 | A1* | 4/2021 | Liu .................. G11C 13/0004 |
| 2021/0159229 | A1 | 5/2021 | Gomes |
| 2022/0045064 | A1 | 2/2022 | Jung et al. |
| 2022/0108988 | A1* | 4/2022 | Kim .................. H10B 12/05 |
| 2022/0130831 | A1 | 4/2022 | Lee et al. |
| 2022/0278121 | A1 | 9/2022 | Lee et al. |
| 2022/0352171 | A1 | 11/2022 | Lee et al. |

FOREIGN PATENT DOCUMENTS

| | | |
|---|---|---|
| CN | 109841630 A | 6/2019 |
| CN | 110164867 A | 8/2019 |
| CN | 110914994 A | 3/2020 |
| CN | 112041997 A | 12/2020 |
| CN | 112385040 A | 2/2021 |
| CN | 114068568 A | 2/2022 |
| JP | 2012150876 A | 8/2012 |
| JP | 2019068067 A | 4/2019 |
| JP | 2019121717 A | 7/2019 |
| JP | 2019140382 A | 8/2019 |
| KR | 20190012061 A | 2/2019 |
| KR | 20190080688 A1 | 7/2019 |
| KR | 20210077098 A | 6/2021 |
| WO | 2020152522 A1 | 7/2020 |
| WO | 2022021014 A1 | 2/2022 |
| WO | 2022077318 A1 | 4/2022 |

OTHER PUBLICATIONS

JP first office action in application No. 2023-501201, mailed on Aug. 20, 2024.
Extended European Search Report in application No. 22835546.7, mailed on Mar. 4, 2024.
KR first office action in application No. 10-2022-7040289, mailed on Apr. 25, 2024.
International Search Report and written opinion in application No. 11202260270Y, mailed on Mar. 3, 2025.
Supplementary European Search Report in the European application No. 22835200.1, mailed on Jan. 2, 2024, 7 pages.
First Office Action of the Korean application No. 10-2022-7039105, issued on Jan. 17, 2024, 11 pages with English translation.

* cited by examiner

SEMICONDUCTOR STRUCTURE AND MANUFACTURING METHOD THEREOF, MEMORY CHIP AND ELECTRONIC DEVICE

CROSS-REFERENCE TO RELATED APPLICATION

This is a continuation of International Patent Application No. PCT/CN2022/109526, filed on Aug. 1, 2022, which claims priority to Chinese Patent Application No. 202210709274.2, filed on Jun. 21, 2022. The disclosures of International Patent Application No. PCT/CN2022/109526 and Chinese Patent Application No. 202210709274.2 are hereby incorporated by reference in their entireties.

BACKGROUND

A semiconductor structure includes a plurality of memory cells, and the memory cells need to be connected to a peripheral circuit to execute a storage function. The higher the integration level of the semiconductor structure is, the greater the number of the memory cells capable of being accommodated in the semiconductor structure is, and the more excellent the performance of the semiconductor structure is. However, many spaces in the current semiconductor structure are wasted. Further, due to the limitation from physical properties, the volume of the memory cell has reached the scaling limit, and due to the limitation from process factors, it is also difficult to increase the number of stacked layers of the memory cell.

Therefore, it is an urgent need of a semiconductor structure with a new architecture to improve the integration level of the semiconductor structure.

SUMMARY

Embodiments of the disclosure belong to the field of semiconductors, and provide a semiconductor structure and a manufacturing method thereof, a memory chip and an electronic device, which at least contributes to improving the integration level of the semiconductor structure.

According to some embodiments of the disclosure, on the one hand, the embodiments of the disclosure provide a semiconductor structure. The semiconductor structure includes: a substrate, on which a stacked structure is provided, where the stacked structure includes a plurality of memory cell groups arranged in a first direction, each of the memory cell groups including multiple layers of memory cells arranged in a second direction, and the stacked structure further includes a plurality of horizontal signal lines arranged in the second direction, and each of the horizontal signal lines is in contact with one layer of the memory cells; and a plurality of leading wire posts arranged in the first direction, where the plurality of leading wire posts and the plurality of horizontal signal lines are arranged along a third direction, and the leading wire posts are contacted with the horizontal signal lines.

According to some embodiments of the disclosure, on the other hand, the embodiments of the disclosure provide a semiconductor structure. The semiconductor structure includes: a substrate, on which a stacked structure is provided, where the stacked structure includes a plurality of memory cell groups arranged in a first direction, each of the memory cell groups including multiple layers of memory cells arranged in a second direction, and the stacked structure further includes a plurality of horizontal signal lines arranged in the second direction, where each of the horizontal signal lines is in contact with one layer of the memory cells; and a plurality of leading wire posts arranged in the first direction and extending along the second direction, where orthographic projections of the plurality of leading wire posts on the surface of the substrate and orthographic projections of the horizontal signal lines on the surface of the substrate are at least partially overlapped, and the leading wire posts are contacted with the horizontal signal lines.

According to some embodiments of the disclosure, on the other hand, the embodiments of the disclosure provide a method for manufacturing a semiconductor structure. The method includes the following operations. A substrate is provided. A stacked structure is formed on the substrate. The stacked structure includes a plurality of memory cell groups arranged in a first direction, each of the memory cell groups including multiple layers of memory cells arranged in a second direction, and the stacked structure further includes a plurality of horizontal signal lines arranged in the second direction, where each of the horizontal signal lines is in contact with one layer of the memory cells. A plurality of leading wire posts arranged in the first direction is formed. The plurality of leading wire posts and the plurality of horizontal signal lines are arranged along a third direction, and the leading wire posts are contacted with the horizontal signal lines.

According to some embodiments of the disclosure, on the other hand, the embodiments of the disclosure provide a method for manufacturing a semiconductor structure. The method includes the following operations. A substrate is provided. A stacked structure is formed on the substrate. The stacked structure includes a plurality of memory cell groups arranged in a first direction, each of the memory cell groups including multiple layers of memory cells arranged in a second direction, and the stacked structure further includes a plurality of horizontal signal lines arranged in the second direction, where each of the horizontal signal lines is in contact with one layer of the memory cells. A plurality of leading wire posts arranged in the first direction and extending along the second direction is formed, where orthographic projections of the plurality of leading wire posts on the surface of the substrate and orthographic projections of the horizontal signal lines on the surface of the substrate are at least partially overlapped, and the leading wire posts are contacted with the horizontal signal lines.

According to some embodiments of the disclosure, the embodiments of the disclosure further provide a memory chip. The memory chip includes the aforementioned semiconductor structures.

According to some embodiments of the disclosure, the embodiments of the disclosure further provide an electronic device. The electronic device includes the aforementioned memory chip.

Technical solutions provided by the embodiments of the disclosure at least have the following advantages.

In some embodiments of the disclosure, the stacked structure includes a plurality of horizontal signal lines arranged in the second direction, each of the horizontal signal lines is contacted with one layer of memory cells in the stacked structure, the plurality of leading wire posts and the plurality of horizontal signal lines are arranged along a third direction, and the leading wire posts are contacted with the horizontal signal lines. That is, in the third direction, the leading wire posts are directly connected to the horizontal signal lines, so that it contributes to reducing the number of staircases or it is no longer to arrange a staircase area independently, thereby improving the integration level of the semiconductor structure.

In some other embodiments of the disclosure, the plurality of leading wire posts extend along the second direction, and orthographic projections of the plurality of leading wire posts on the surface of the substrate and orthographic projections of the horizontal signal lines on the surface of the substrate are at least partially overlapped. That is, the leading wire posts are directly connected to the horizontal signal lines in an alternative manner, so that it contributes to reducing the number of staircases or it is no longer to arrange a staircase area independently, thereby improving the integration level of the semiconductor structure.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure. It is apparent that the accompanying drawings described below are merely some embodiments of the disclosure, and other drawings can be obtained by those of ordinary skill in the art according to these accompanying drawings without creative efforts.

DETAILED DESCRIPTION

Figure 1:
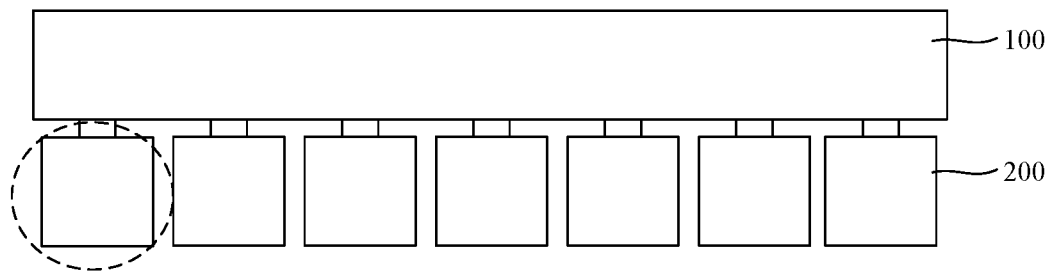
FIG. 1 illustrates a top view of a semiconductor structure.
Figure 2:
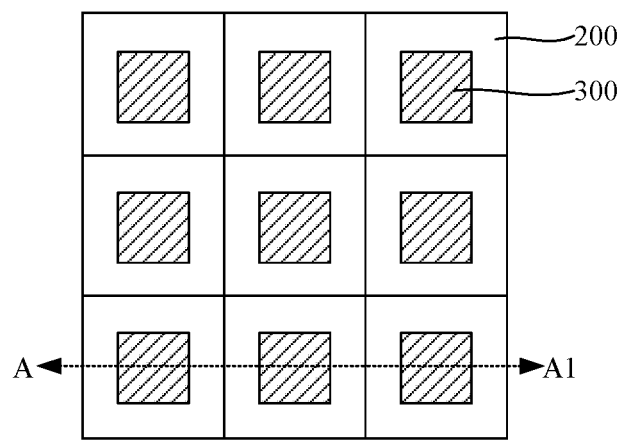
FIG. 2 illustrates a partial enlarged drawing of FIG. 1.
Figure 3:
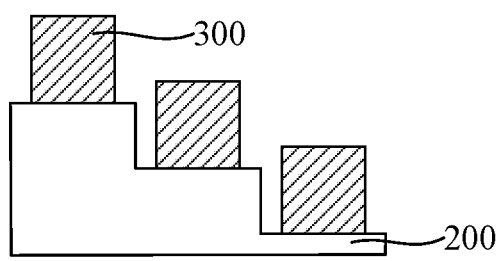
FIG. 3 illustrates a section view of FIG. 2 in the direction A-A1.

FIG. 1 is a top view of a semiconductor structure. FIG. 2 is an enlarged drawing of a staircase in a dotted circle in FIG. 1. FIG. 3 is a section view of FIG. 2 in the direction A-A1. Referring to FIG. 1 to FIG. 3, the semiconductor structure includes a memory cell area 100 and a staircase area 200. There are multiple layers of memory cells in the memory cell area 100. There are multiple staircases in the staircase area 200, and the staircases and the memory cells are arranged in one-to-one correspondence. A connecting layer (not shown in the drawing) can be arranged in the staircase, a leading wire post 300 can be arranged on the staircase, and the leading wire post 300 are electrically contacted with the memory cell through the connecting layer in the staircase, so as to lead out the memory cell, so that it is convenient to connect the memory cell to a peripheral circuit. However, with increase of stacked layers of the memory cells, the area occupied by the staircase area 200 will be larger and larger. For example, if there are totally 64 layers of memory cells, correspondingly, 64 staircases are needed, and the lower the staircase is, the larger the area is. If the area of the topmost staircase is 0.25 $\mu m^2$, the area of the bottommost staircase is 64*0.25=16 $\mu m^2$. Referring to FIG. 3, the connecting layer below each staircase only provides support and electric connection, so that the bottom space is wasted. Therefore, the integration level of the semiconductor structure needs to be further improved.

The embodiments of the disclosure provide a semiconductor structure. In such semiconductor structure, the plurality of leading wire posts and the plurality of horizontal signal lines are arranged along the third direction, and the leading wire posts and the horizontal signal lines are connected; alternatively, the plurality of leading wire posts extend along the second direction, and orthographic projections of the plurality of leading wire posts on the surface of the substrate are at least partially overlapped with orthographic projections of the horizontal signal lines on the surface of the substrate. That is, the leading wire posts and the horizontal signal lines are directly connected in a parallel manner or an alternative manner. Therefore, it is unnecessary to connect the leading wire posts to the horizontal signal lines through a connection layer in the staircase area, so that the space utilization ratio in the semiconductor structure is improved, thereby improving the integration level of the semiconductor structure.

The embodiments of the disclosure will be described below in detail in combination with the drawings. However, those of ordinary skill in the art may understand that many technical details are provided to better understand the disclosure in the embodiments of the disclosure. However, the technical solutions claimed by the disclosure may also be implemented even though there are no these technical details and various changes and modifications based on the following embodiments.

As shown in FIG. 4-FIG. 28, an embodiment of the disclosure provide a semiconductor structure. The semiconductor structure includes: a substrate (not shown in the drawings), on which a stacked structure is provided, the stacked structure includes a plurality of memory cell groups TC0 arranged in the first direction X, and each of the memory cell groups TC0 includes multiple layers of memory cells TC arranged in a second direction Z, and the stacked structure further includes a plurality of horizontal signal lines 3 arranged in the second direction Z, and each of the horizontal signal lines 3 is contacted with one layer of the memory cells TC; and a plurality of leading wire posts 5 arranged in a first direction X, the plurality of leading wire posts 5 and the plurality of horizontal signal lines 3 are arranged along a third direction Y, and the leading wire posts 5 are contacted with the horizontal signal lines 3.

That is, the edge of the orthographic projection of the leading wire post 5 on the surface of the substrate is in contact with the edge of the orthographic projection of the horizontal signal line 3 on the surface of the substrate. In other words, at least part of side walls of the leading wire post 5 is directly contacted with a side wall of the horizontal signal line 3, and it is unnecessary to connect indirectly through the connection layer of the staircase area, so that the numbers of the connection layers and the staircases may be decreased, thereby facilitating to improve the integration level of the semiconductor structure.

The semiconductor structure will be described below in detail in combination with the drawings.

Figure 10:
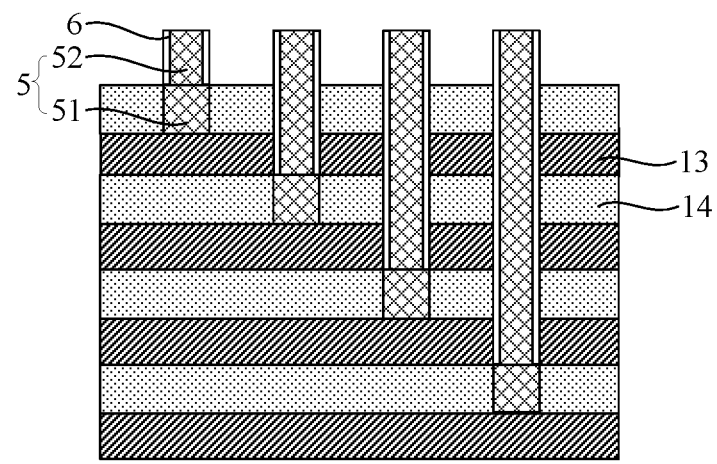
FIG. 10 illustrates another partial side view of a semiconductor structure provided by an embodiment of the disclosure.

It is to be noted first that FIG. 6-FIG. 10 are partial top views. For a more intuitive purpose, FIG. 6-FIG. 9 do not illustrate a structure for isolating and supporting the leading wire post 5 in the semiconductor structure. FIG. 10 illustrates the structure for isolating and supporting the leading wire post 5.

In some embodiments, referring to FIG. 6-FIG. 10, each horizontal signal line 3 is at least contacted with one leading wire post 5. That is, each horizontal signal line 3 may be directly contacted with the leading wire post 5, so as to be led out by the leading wire post 5. Therefore, it may be unnecessary to arrange the staircase area independently, so that the space utilization ratio of the semiconductor structure can be improved to a great extent, and it contributes to simplifying the production process.

Figure 6:
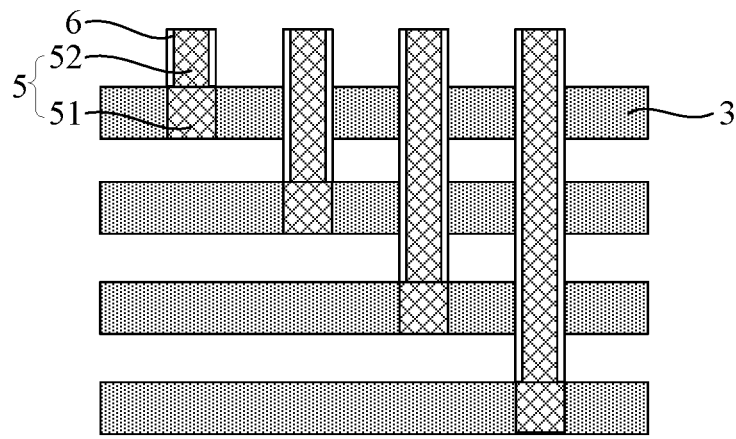
FIG. 6 illustrates a partial side view of a semiconductor structure provided by an embodiment of the disclosure.
Figure 7:
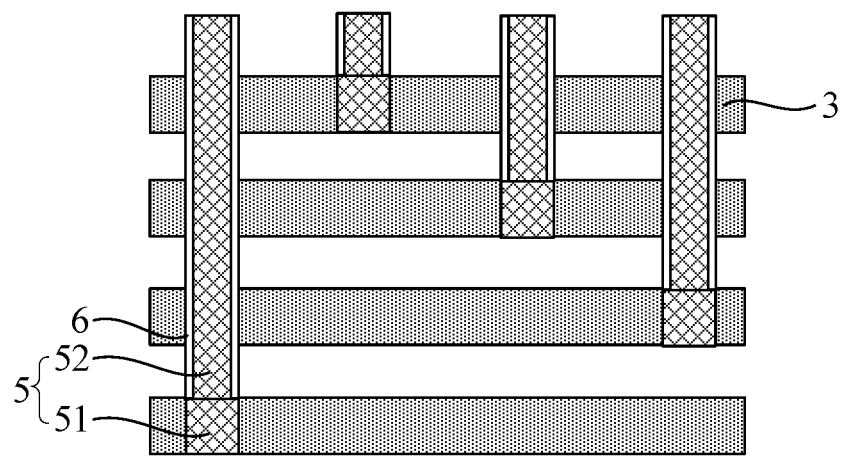
FIG. 7 illustrates another partial side view of a semiconductor structure provided by an embodiment of the disclosure.
Figure 8:
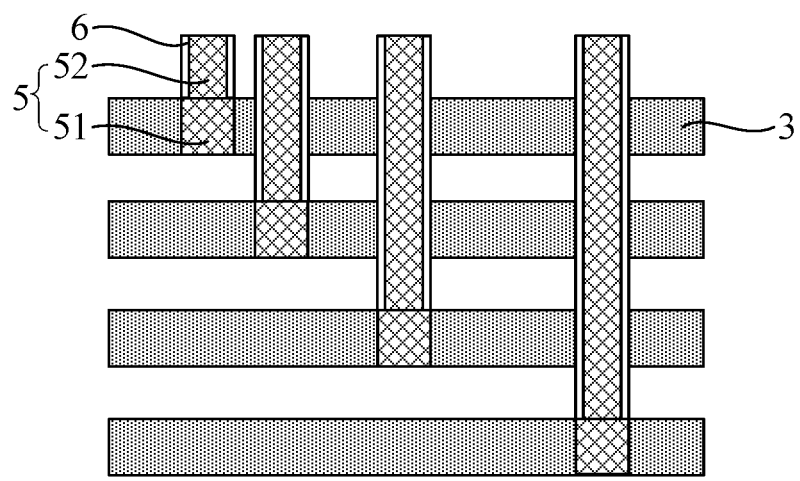
FIG. 8 illustrates another partial side view of a semiconductor structure provided by an embodiment of the disclosure.
Figure 9:
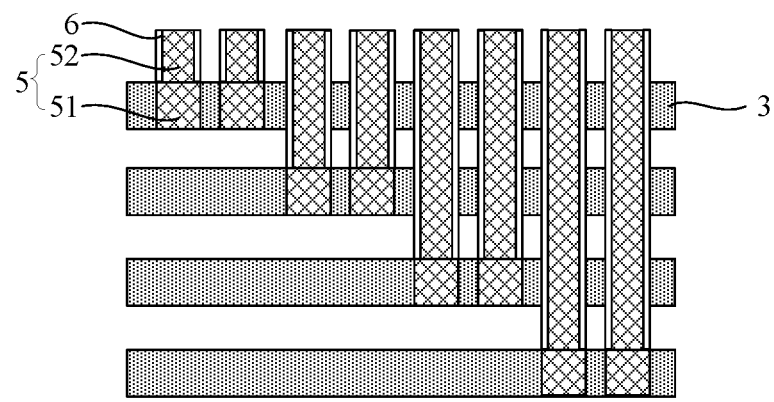
FIG. 9 illustrates another partial side view of a semiconductor structure provided by an embodiment of the disclosure.

Exemplarily, referring to FIG. 6-FIG. 8, the plurality of horizontal signal lines 3 are contacted with the plurality of leading wire posts 5 in one-to-one correspondence. That is, each horizontal signal line 3 is contacted with one leading wire post 5, so as to reduce the connection positions between the horizontal signal lines 3 and the leading wire posts 5, and make the production process simpler. In some other embodiments, referring to FIG. 9, one horizontal signal line 3 may also be contacted with the plurality of leading wire posts so that the contact regions between the horizontal signal line 3 and the leading wire posts may be increased, and the contact resistance is reduced.

In some embodiments, referring to FIG. 4-FIG. 13, the leading wire posts 5 extend along the second direction Z. That is, the plurality of leading wire posts 5 are parallel one another, and the extension directions of the leading wire posts 5 are the same as the stacking direction of the memory cells TC, which contributes to simplifying the process and improving the uniformity of the semiconductor structure. Exemplarily, the stacking direction of the memory cells TC is the second direction Z which is perpendicular to the surface of the substrate.

Referring to FIG. 4-FIG. 11, it is to be noted that with respect to the leading wire post 5 contacted with the horizontal signal line 3 of the non-top layer, the leading wire post may be arranged adjacent to multiple layers of horizontal signal lines 3. It may be known based on a leading function of the leading wire posts 5 that, each leading wire post 5 is only connected to one horizontal signal line 3, rather than two horizontal signal lines 3 at the same time. Otherwise, signal disturbance occurs. In order to facilitate understanding, the horizontal signal line 3 connected to the leading wire post 5 is called as the horizontal signal line 3 of the corresponding layer. The leading wire post 5 is arranged to be insulated from horizontal signal lines 3, except the horizontal signal line 3 of the corresponding layer. In addition, the leading wire post 5 is divided into a contact portion 51 and an extension portion 52 arranged in a stacked manner. The contact portion 51 and the horizontal signal line 3 of the corresponding layer are arranged in the same layer and are connect to each other. The extension portion 52 is arranged adjacent to the horizontal signal line 3 above the corresponding layer, but insulated from the horizontal signal line.

Correspondingly, referring to FIG. 5-FIG. 13, the stacked structure may further include a dielectric layer 6. The dielectric layer 6 is at least located on a side wall of the leading wire post 5 facing the horizontal signal line 3 above the corresponding layer, and the lower surface of the dielectric layer 6 is higher than the horizontal signal line 3 connected to the leading wire post 5. That is, the dielectric layer 6 is used for isolating the leading wire post 5 from the horizontal signal lines 3 out of the corresponding layer, so as to avoid incorrect electrical connections. Specifically, the dielectric layer 6 may encircle the side walls of the extension portion 52 of the leading wire post 5. A material of the dielectric layer 6 may be a material with a low dielectric constant, such as silicon nitride or silicon oxide.

In some embodiments, referring to FIG. 4-FIG. 10, the leading wire posts 5 connected to different horizontal signal lines 3 are different in length in the second direction Z, and the bottoms of the leading wire posts 5 are contacted with the horizontal signal lines 3. Exemplarily, the leading wire post 5 connected to the horizontal signal line 3 of the top layer is the shortest in the second direction Z, and the leading wire post 5 connected to the horizontal signal line 3 of the bottom layer is the longest in the second direction Z, which contributes to saving the material, so as to further reduce the production cost, and further contributes to simplifying the production process. In some other embodiments, the leading wire posts 5 may be same in length, but the leading wire posts 5 are only connected to the horizontal signal lines 3 of the corresponding layer and are arranged to be insulated from the horizontal signal lines 3 above and below the corresponding layer.

In order to increase the contact region between the leading wire post 5 and the horizontal signal line 3 to decrease the contact resistance, the bottom surface of the leading wire post 5 may be aligned with the bottom surface of the horizontal signal line 3 of the corresponding layer; alternatively, the bottom surface of the leading wire post 5 may be slightly lower than the bottom surface of the horizontal signal line 3 of the corresponding layer. In some other embodiments, the bottom surface of the leading wire post 5 may be higher than the bottom surface of the horizontal signal line 3 of the corresponding layer, but lower than the top surface of the horizontal signal line 3 of the corresponding layer.

In some embodiments, referring to FIG. 6-FIG. 7, the adjacent leading wire posts are arranged at an equal spacing in the first direction X. That is, the spacing between the adjacent leading wire posts 5 is the same, so that the uniformity of the semiconductor structure is improved.

Referring to FIG. 6, the leading wire posts 5 may be arranged in the order of the length magnitude in the second direction Z. In some other embodiments, referring to FIG. 7, the lengths of the leading wire posts 5 may not be increased or decreased progressively but alternative in length, so that a large parasitic capacitance is prevented from being generated between the longer leading wire posts 5.

In some other embodiments, referring to FIG. 8, a spacing between the adjacent leading wire posts 5 is in proportion to an area of a directly facing region. It is to be noted that the area of the directly facing region between the adjacent leading wire posts 5 is in proportion to the magnitude of the parasitic capacitance. Therefore, in a case that the area of the directly facing region between the adjacent leading wire posts 5 is large, the spacing between the leading wire posts may be correspondingly increased to reduce the parasitic capacitance.

Figure 11:
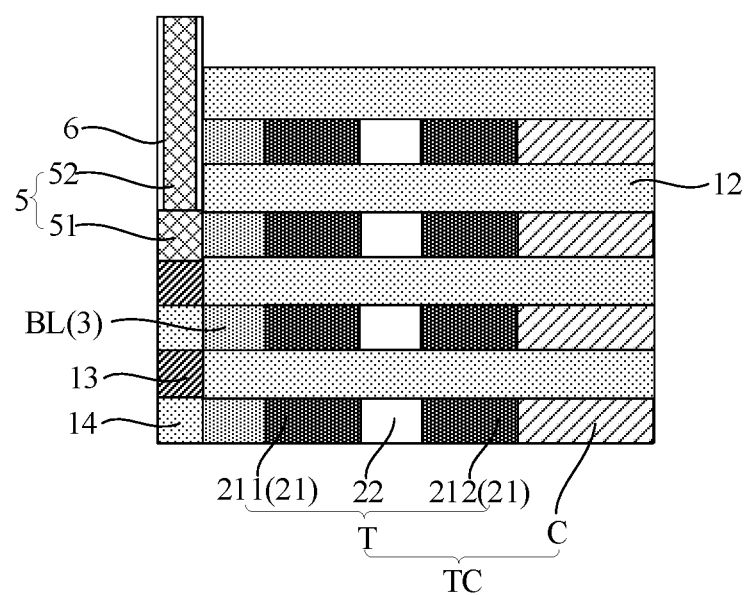
FIG. 11 illustrates a partial section view of a semiconductor structure provided by an embodiment of the disclosure.
Figure 12:
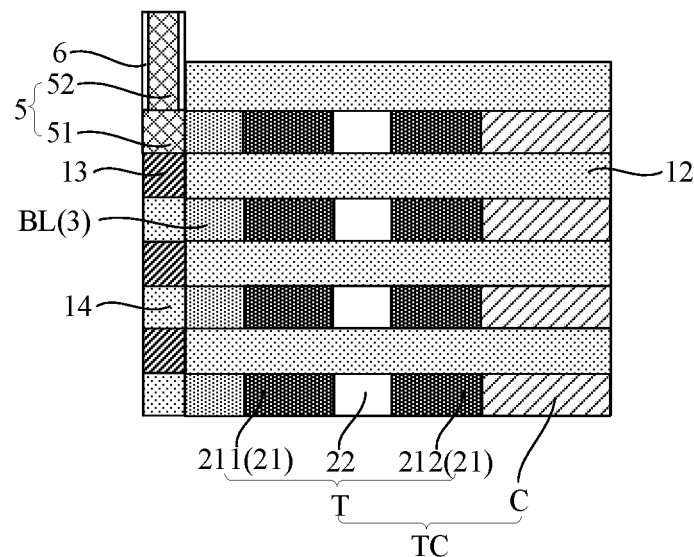
FIG. 12 illustrates another partial section view of a semiconductor structure provided by an embodiment of the disclosure.

In some embodiments, referring to FIG. 10-FIG. 12, the stacked structure further includes multiple etching barrier layers 13 arranged in the second direction Z, and each etching barrier layer 13 is contacted with a bottom surface of at least one leading wire post Specifically, a method for forming the leading wire post 5 includes: forming a through hole 8 (referring to FIG. 53) in one side of the horizontal signal line 3 by adopting an etching process, and depositing a conductive material in the through hole 8 to form the leading wire post 5. Therefore, the position of the through hole 8 decides the position of the leading wire post 5. The etching barrier layer 13 may stop etching to realize a self-aligning function, so as to avoid the problem of over-etching or insufficient etching of the through hole 8. That is to say, the etching barrier layers 13 and isolation layers 14 are alternatively arranged in the second direction Z, the etching barrier layer 13 directly faces a gap between the two adjacent horizontal signal lines 3, the isolation layer 14 and the horizontal signal line 3 are arranged in the same layer, and the etch selectivity ratio of the isolation layer 14 to the etching barrier layer 13 is large. Exemplarily, a material of the isolation layer 14 may be silicon oxide, and a material of the etching barrier layer 13 may be silicon nitride. In addition, the etching barrier layer 13 may also provide an isolating function.

Figure 13:
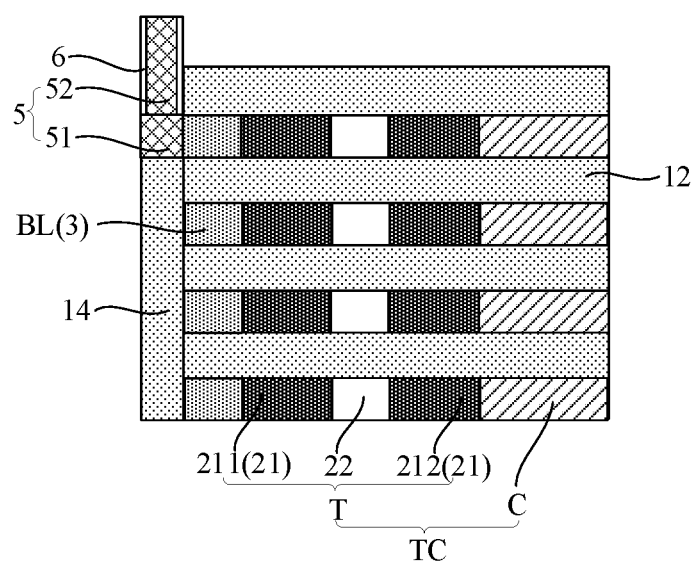
FIG. 13 illustrates another partial section view of a semiconductor structure provided by an embodiment of the disclosure.

In some other embodiments, referring to FIG. 13, only the isolation layer 14 may be arranged on one side of the horizontal signal line 3, and no etching barrier layer 13 is arranged. Correspondingly, in the process of forming the through hole 8, the depth of the through hole 8 is controlled by means of an etching time. Therefore, only one etching agent may be used, thereby simplifying the manufacturing process.

Referring to FIG. 4-FIG. 5 and FIG. 11-FIG. 28, the memory cell TC includes a channel region 22 and source/drain doped regions 21 arranged in the third direction Y, and the source/drain doped regions 21 are located on two sides of the channel region 22. That is, the memory cell TC at least includes a transistor T. In some other embodiments, the memory cell TC may further include a capacitor C. The transistor T and the capacitor C are arranged in the third direction Y. Exemplarily, in a Dynamic Random Access Memory (DRAM), the memory cell TC includes a transistor T and a capacitor C. In some other embodiments, the memory cell TC may only include the transistor T. For example, in a Static Random-Access Memory (SRAM), the memory cell TC is composed of six transistors T. For another example, a Capacitorless Double Gate Quantum Well Single Transistor (1T DRAM), the memory cell TC is composed of one dual gate transistor T.

Figure 4:
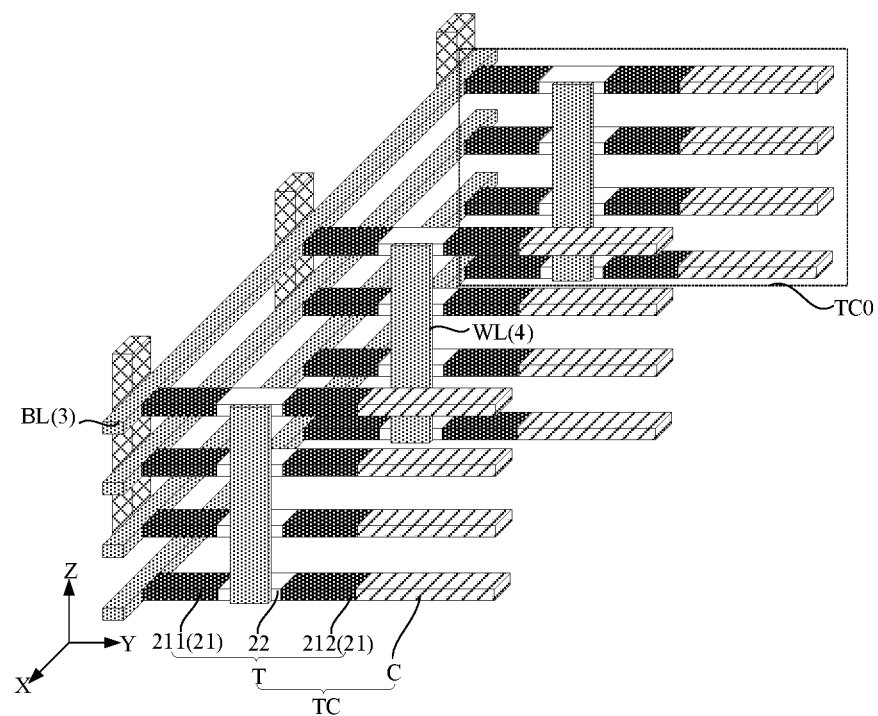
FIG. 4 illustrates a stereogram of a semiconductor structure provided by an embodiment of the disclosure.
Figure 5:
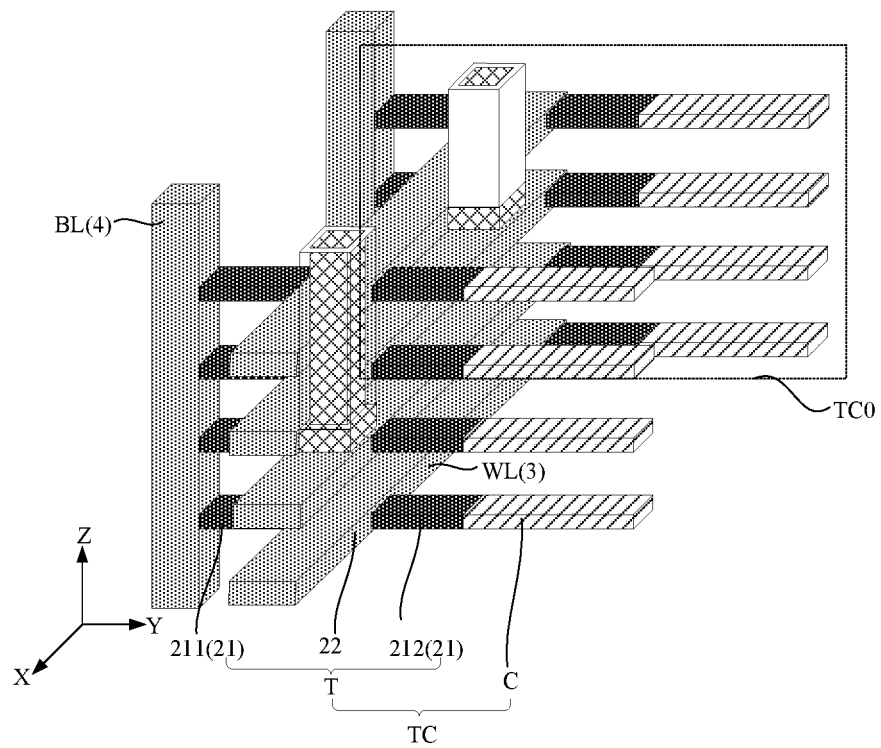
FIG. 5 illustrates a stereogram of another semiconductor structure provided by an embodiment of the disclosure.

Referring to FIG. 4-FIG. 5, the stacked structure further includes perpendicular signal lines 4 extending along the second direction Z and contacted with multiple layers of memory cells TC of the same memory cell group TC0. One of the horizontal signal line 3 and the perpendicular signal line 4 is a bit line (BL), and the other of the horizontal signal line 3 and the perpendicular signal line 4 is a word line (WL). The BL is contacted with the source/drain doped region 21, and the WL is contacted with the channel region 22. The source/drain doped region 21 contacted with the BL is called as the first source/drain doped region 211, and the source/drain doped region 21 arranged spaced from the BL is called as the second source/drain doped region 212.

Position relationships between the horizontal signal lines 3 and the leading wire posts 5 will be described below in detail in two situations: the horizontal signal lines are BLs and the horizontal signal lines are WLs.

In a case that the horizontal signal lines 3 are BLs, the horizontal signal lines 3 and the leading wire posts 5 mainly have the following several position relationships.

In example 1, referring to FIG. 14-FIG. 18, the leading wire post 5 and the memory cell TC are respectively located on two opposite sides of the horizontal signal line 3 arranged in the third direction Y, that is, the leading wire post 5 is located on the side of the horizontal signal line 3 away from the memory cell TC. Therefore, it may be more flexible to set arrangement positions and dimensions of the leading wire posts 5.

Figure 14:
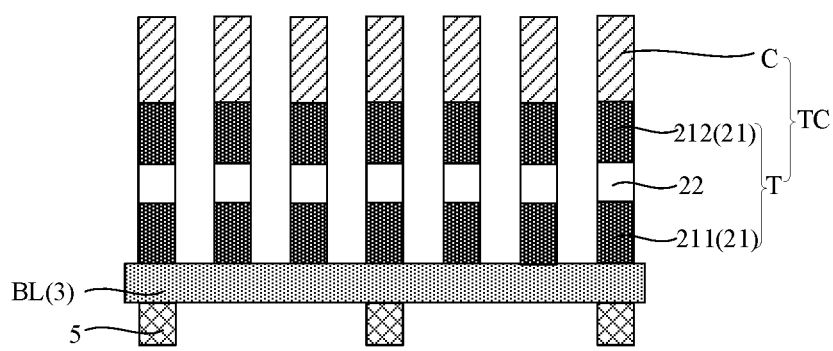
FIG. 14 illustrates a top view of a semiconductor structure provided by an embodiment of the disclosure.
Figure 15:
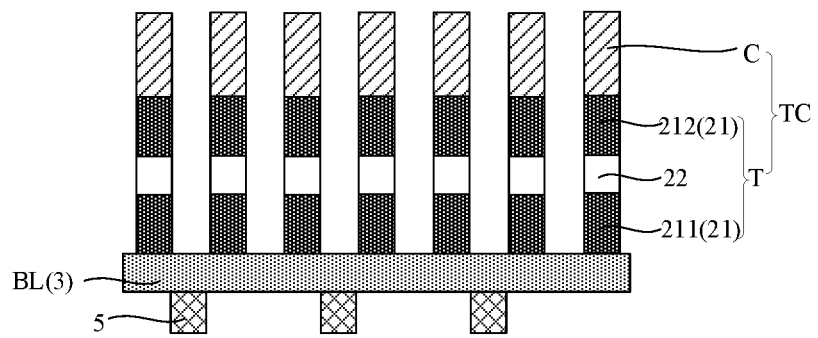
FIG. 15 illustrates another top view of a semiconductor structure provided by an embodiment of the disclosure.
Figure 16:
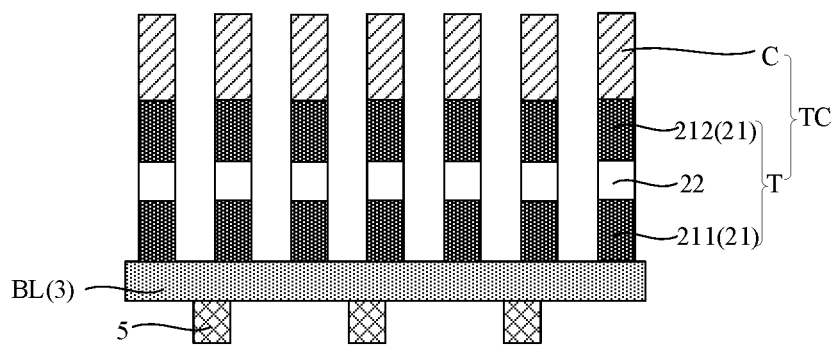
FIG. 16 illustrates another top view of a semiconductor structure provided by an embodiment of the disclosure.
Figure 17:
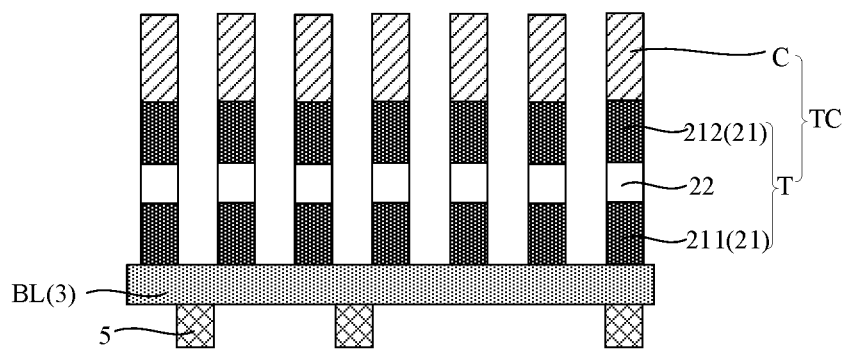
FIG. 17 illustrates another top view of a semiconductor structure provided by an embodiment of the disclosure.

Specifically, referring to FIG. 14, in some embodiments, the leading wire post 5 directly faces the memory cell group TC0 in the third direction Y, which contributes to improving the uniformity of position arrangement. In some other embodiments, referring to FIG. 15, the leading wire posts 5 and the memory cell groups TC0 are arranged alternatively in the first direction X, that is, the leading wire post 5 directly faces the space between adjacent memory cell groups TC0. In some other embodiments, referring to FIG. 16, the leading wire post 5 is arranged simultaneously opposite the memory cell group TC0 and the space between the adjacent memory cell groups TC0. In some other embodiments, referring to FIG. 17, a part of leading wire posts 5 directly faces the space between adjacent memory cells TC0, and part of leading wire posts 5 directly faces the memory cell group TC0.

Continuously referring to FIG. 14-FIG. 17, in order to reduce the parasitic capacitance between the adjacent leading wire posts 5, the gap between the adjacent leading wire posts 5 may be arranged opposite at least one memory cell group TC0. In addition, referring to FIG. 14-FIG. 16, in order to increase the uniformity of the semiconductor structure, the spacings between the adjacent leading wire posts 5 may be the same. In addition, referring to FIG. 17, the spacings between the adjacent leading wire posts 5 may be adjusted according to different areas of the directly facing regions, so as to balance the parasitic capacitance among different leading wire posts 5.

In some embodiments, referring to FIG. 14-FIG. 17, the width of the leading wire post 5 in the first direction X is equal to the width of the memory cell group TC0, so that it contributes to unifying characteristic sizes of different structures, so as to simplify the production process. In some other embodiments, referring to FIG. 18, the width of the leading wire post 5 in the first direction X is greater than the width of the memory cell group TC0, so that it contributes to increasing the contact region between the leading wire post 5 and the horizontal signal line 3 of the corresponding layer, so as to reduce the contact resistance.

In addition, the width of the leading wire post 5 in the first direction X may be greater than or equal to the spacing between adjacent memory cell groups TC0. Such arrangement contributes to increasing the contact region between the leading wire post 5 and the horizontal signal line 3 of the corresponding layer, so as to reduce the contact resistance.

Figure 18:
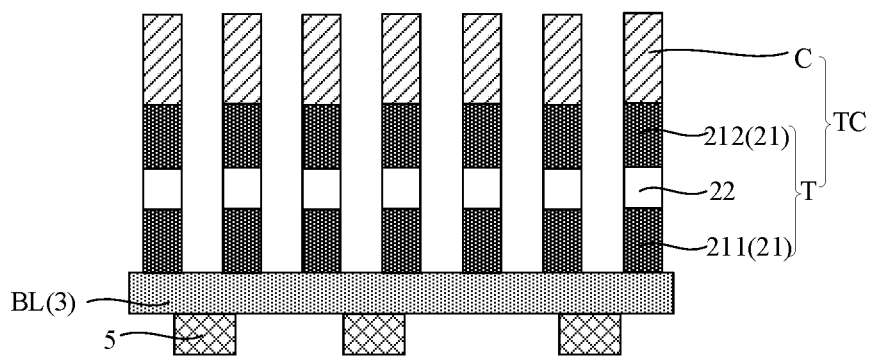
FIG. 18 illustrates another top view of a semiconductor structure provided by an embodiment of the disclosure.

In addition, referring to FIG. 18, the width of the leading wire post 5 in the first direction X is greater than the width of the leading wire post 5 in the third direction Y. It is to be noted that the horizontal signal line 3 has a long length in the first direction X, and thus the leading wire post 5 has an enough accommodation space in the first direction X. In order to improve the utilization ratio of a semiconductor space while increasing the cross sectional areas of the leading wire posts 5, the leading wire posts 5 may be arranged in the first direction X and the third direction Y with certain width differences.

Figure 19:
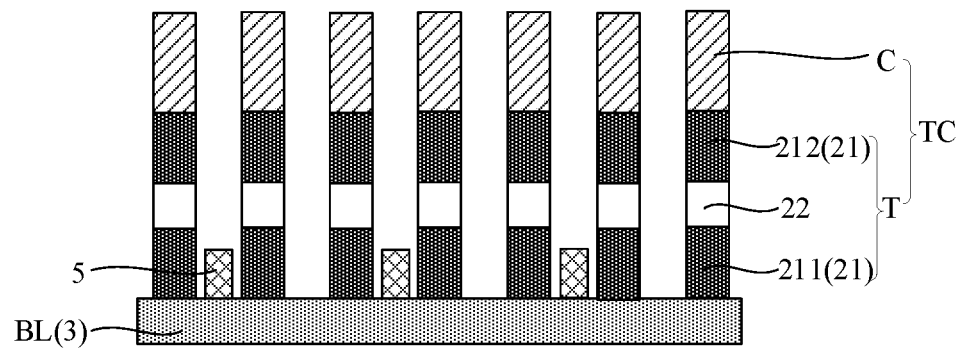
FIG. 19 illustrates another top view of a semiconductor structure provided by an embodiment of the disclosure.
Figure 20:
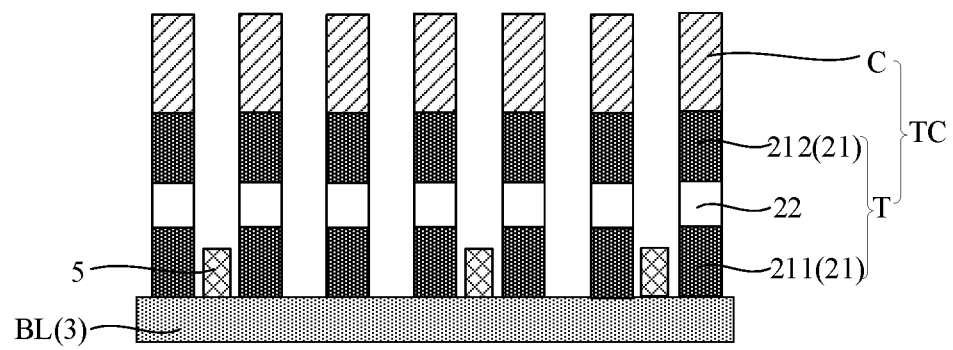
FIG. 20 illustrates another top view of a semiconductor structure provided by an embodiment of the disclosure.

In example 2, referring to FIG. 19-FIG. 20, the leading wire post 5 and the memory cell TC are located on the same side of the horizontal signal line 3. That is, the leading wire post 5 is located between adjacent memory cell groups TC0.

Therefore, it contributes to making full use of the space position in the stacked structure, thereby improving the space utilization ratio.

Continuously referring to FIG. 19-FIG. 20, in order to reduce the parasitic capacitance between adjacent leading wire posts 5, the adjacent leading wire posts 5 may be spaced by at least two memory cell groups TC0. In addition, referring to FIG. 19, in order to increase the uniformity of the semiconductor structure, the number of the memory cell groups TC0 spaced between the adjacent leading wire posts 5 may be the same. In addition, referring to FIG. 20, the number of the memory cell groups TC0 spaced between the adjacent leading wire posts 5 may be adjusted according to different areas of the directly facing regions, so as to balance the parasitic capacitance among different leading wire posts 5.

In some embodiments, referring to FIG. 19-FIG. 20, the width of the leading wire post 5 in the third direction Y is greater than the width of the leading wire post 5 in the first direction X. Therefore, not only can the spacing between the adjacent memory cell groups TC0 be reduced, so as to reduce the area occupied by the stacked structure on the surface of the substrate, but also the cross sectional area of the leading wire post 5 can be increased, so as to reduce the contact resistance of the leading wire post 5. In some other embodiments, the width of the leading wire post 5 in the third direction Y may be equal to the width of the leading wire post 5 in the first direction X.

It is to be noted that the example 1 and example 2 may be combined, that is, part of leading wire posts 5 is located on one side of the horizontal signal line 3 and the other part of leading wire posts 5 is located on the other side of the horizontal signal line 3.

In some embodiments, referring to FIG. 14-FIG. 20, there is one memory cell in each layer of the memory cell group TC0. In another embodiment, referring to FIG. 21-FIG. 22, there are two memory cells TC in each layer of the memory cell group TC0, and two memory cells TC are respectively located in two opposite sides of the horizontal signal line 3 arranged in the third direction Y. Since the number of the memory cells TC in the memory cell group TC0 is increased, the storage capacity of the semiconductor is correspondingly enhanced.

Figure 21:
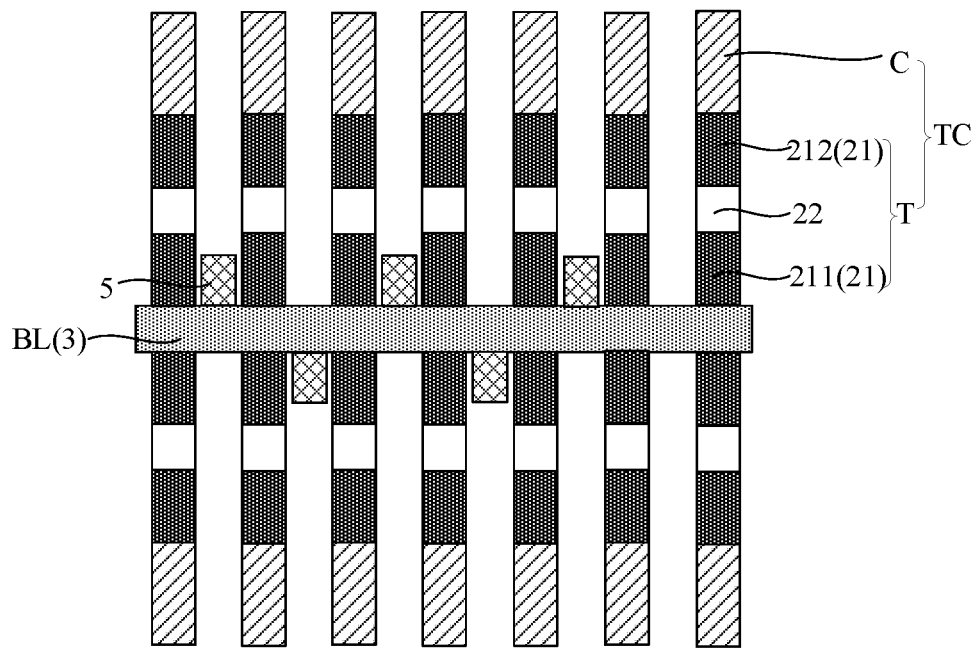
FIG. 21 illustrates another top view of a semiconductor structure provided by an embodiment of the disclosure.

In some embodiments, referring to FIG. 21, part of leading wire posts 5 may be located between adjacent memory cells TC0 of a stacked structure, and part of leading wire posts 5 may be located between adjacent memory cells TC0 of another stacked structure. That is, a plurality of leading wire posts 5 are located on two different sides of the horizontal signal line 3. For example, adjacent leading wire posts 5 are located on different sides of the horizontal signal line 3. In other words, two adjacent leading wire posts 5 are staggered in the first direction X, so that the parasitic capacitance may be reduced.

Figure 22:
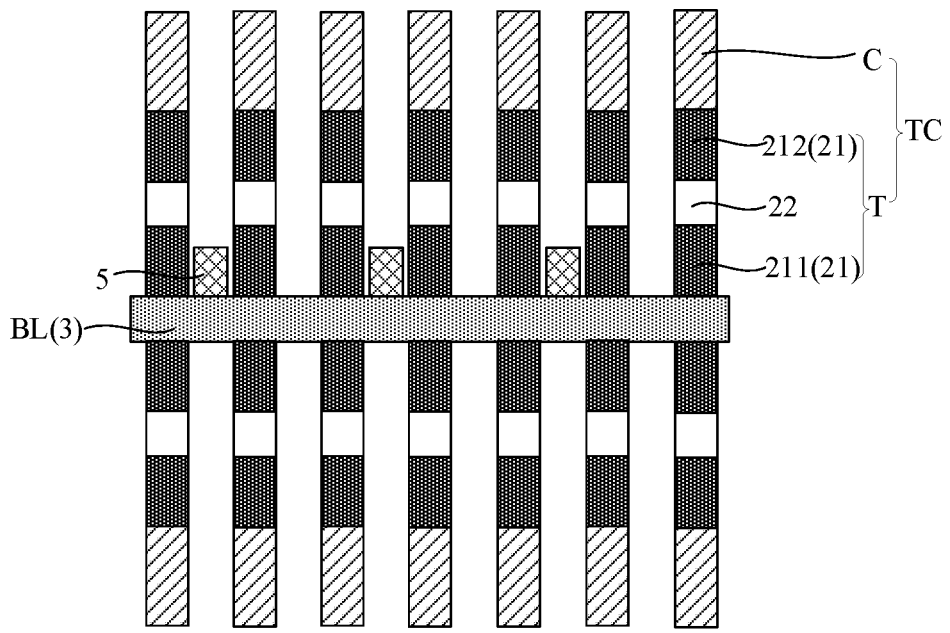
FIG. 22 illustrates another top view of a semiconductor structure provided by an embodiment of the disclosure.

In some other embodiments, referring to FIG. 22, all the leading wire posts 5 are located on the same side of the horizontal signal line 3, so that it contributes to improving the uniformity of the arrangement mode of the leading wire posts 5, so as to simplify the manufacturing process of the semiconductor.

Figure 23:
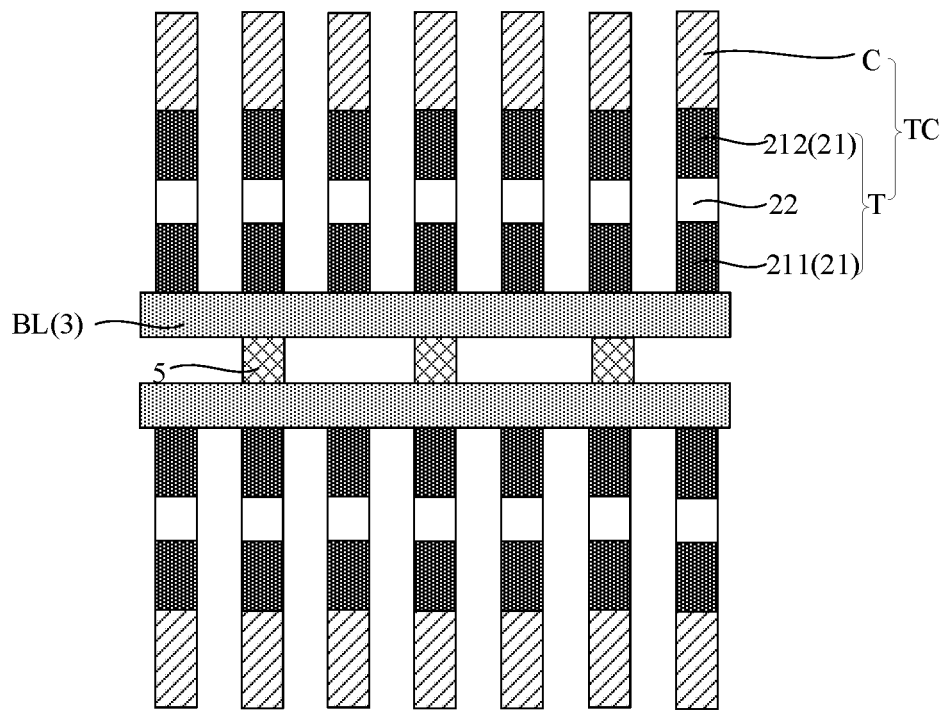
FIG. 23 illustrates another top view of a semiconductor structure provided by an embodiment of the disclosure.
Figure 24:
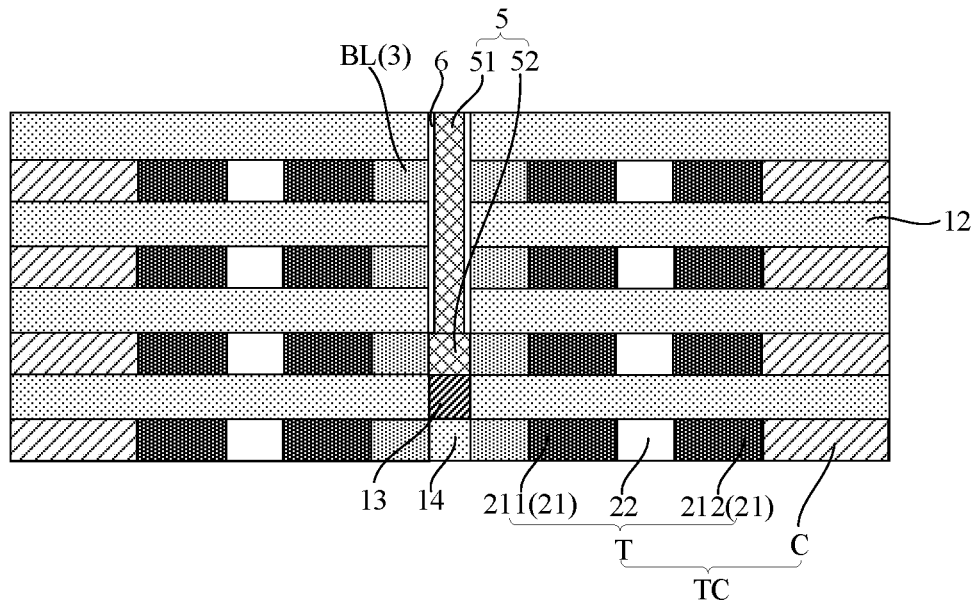
FIG. 24 illustrates another partial section view of a semiconductor structure provided by an embodiment of the disclosure.

It is to be noted that in some embodiments, one leading wire post 5 may only be used for leading out one horizontal signal line 3 of one stacked structure. In some other embodiments, one leading wire post 5 may be shared by two stacked structures. Specifically, referring to FIG. 23-FIG. 24, FIG. 23 is a top view, and FIG. 24 is a section view of FIG. 23 in the third direction Y. The horizontal signal lines 3 of two adjacent stacked structures are arranged opposite. The leading wire post 5 is located between the horizontal signal lines 3 of the adjacent stacked structures, and the horizontal signal lines 3 of the same layer of the adjacent stacked structures are electrically connected through at least one leading wire post 5. Since the leading wire post 5 may be shared by two stacked structures, the number of the leading wire posts 5 may be decreased, so that it contributes to reducing the volume of the semiconductor structure.

It is to be noted that although the horizontal signal lines 3 of two stacked structures are electrically connected, the memory cells TC corresponding to the horizontal signal lines 3 are still controlled by different WLs, and therefore, the memory cells TC of the two stacked structures can still be controlled independently.

In a case that the horizontal signal lines 3 are WLs, the horizontal signal lines 3 and the leading wire posts mainly have the following several position relationships.

First, it is to be noted that there are various position relationships between the WL and the channel region 22. For example, the WL may cover the entire channel region 22. Alternatively, the WL(s) may be contacted with the top surface and/or the bottom surface of the channel region 22. If the WL covers the entire channel region 22, the area of the side wall of the WL is larger. Since the side wall of the WL is contacted with a side wall of the leading wire post 5, the larger area of the side wall of the WL is beneficial to increasing the contact region between the WL and the leading wire post 5, thereby reducing the contact resistance. In a case that the WLs are located on the top surface and the bottom surface of the channel region 22, in order to increase the contact regions, the leading wire posts 5 may be simultaneously contacted with the WLs on the top surface and the bottom surface of the channel region 22.

Figure 25:
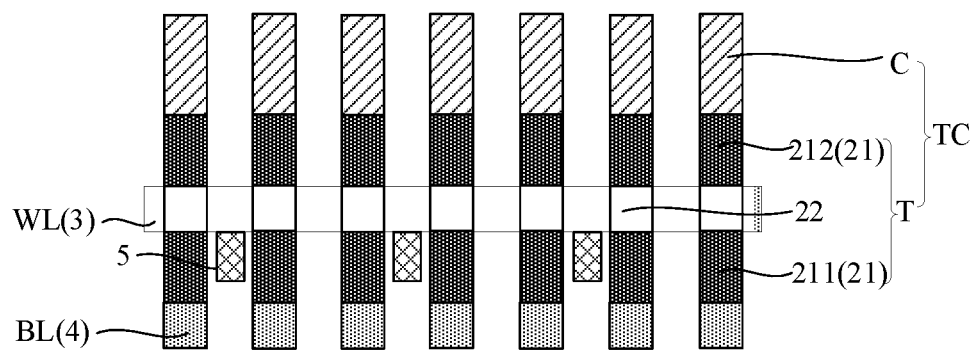
FIG. 25 illustrates another top view of a semiconductor structure provided by an embodiment of the disclosure.
Figure 26:
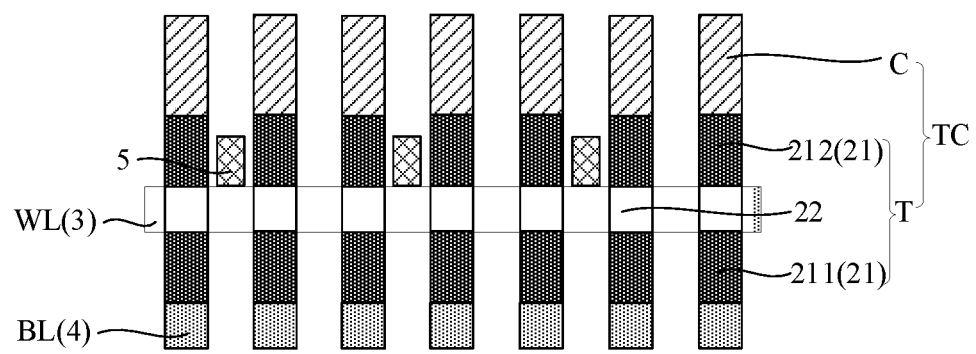
FIG. 26 illustrates another top view of a semiconductor structure provided by an embodiment of the disclosure.
Figure 27:
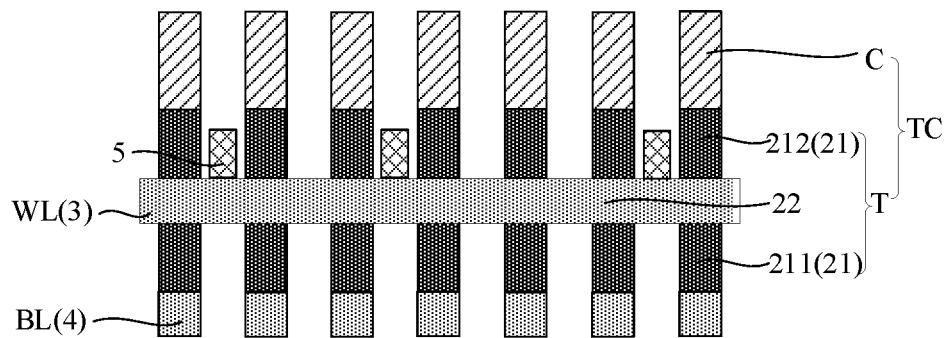
FIG. 27 illustrates another top view of a semiconductor structure provided by an embodiment of the disclosure.

In some other embodiments, referring to FIG. 25-FIG. 27, all the leading wire posts 5 are located on the same side of the horizontal signal line 3, so that it contributes to improving the uniformity of the arrangement of the leading wire posts 5, so as to simplify the manufacturing process of the semiconductor. Exemplarily, referring to FIG. 25, all the leading wire posts 5 are located on the side of the horizontal signal line 3 close to the first source/drain doped region 211. Referring to FIG. 26-FIG. 27, all the leading wire posts 5 are located on the side of the horizontal signal line 3 close to the second source/drain doped region 212.

Referring to FIG. 25-FIG. 27, in order to reduce the parasitic capacitance, the adjacent leading wire posts 5 may be spaced at least by two memory cell groups TC0. In addition, referring to FIG. 25 and FIG. 26, in order to increase the uniformity of the semiconductor structure, the number of memory cell groups TC0 between the adjacent leading wire posts 5 may be the same. Alternatively, referring to FIG. 27, the number of the memory cell groups TC0 spaced between the adjacent leading wire posts 5 may be adjusted according to different areas of the directly facing regions, so as to balance the parasitic capacitance among different leading wire posts 5.

Figure 28:
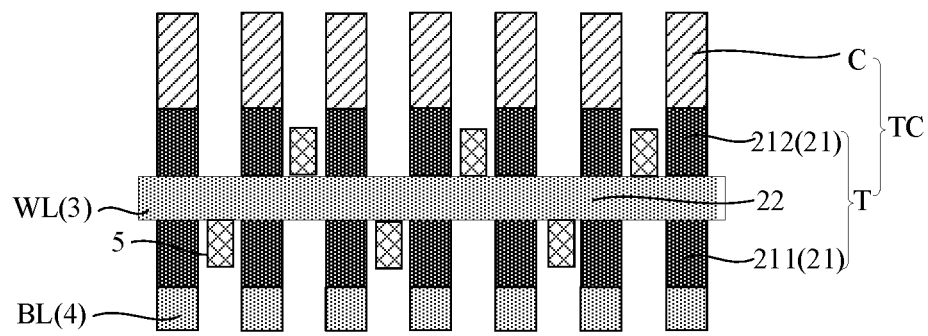
FIG. 28 illustrates another top view of a semiconductor structure provided by an embodiment of the disclosure.

In some other embodiments, referring to FIG. 28, part of leading wire posts 5 may be located on one side of the horizontal signal line 3 and part of leading wire posts 5 may be located on the other side of the horizontal signal line 3. Exemplarily, adjacent leading wire posts 5 are located on different sides of the horizontal signal line 3, that is, the leading wire posts 5 may be staggered in the first direction X, so that the parasitic capacitance is reduced.

In an embodiment of the disclosure, the plurality of leading wire posts 5 and the plurality of horizontal signal lines are arranged along the third direction Y, and the leading wire posts 5 are connected to the horizontal signal lines 3. That is, an edge of the orthographic projection of the leading wire posts 5 on the surface of the substrate is in contact with an edge of the orthographic projection of the horizontal signal line 3 on the surface of the substrate. Since the leading wire posts 5 are directly connected to the horizontal signal lines 3, the numbers of the connection layers and the staircases may be decreased, thereby improving the integration level of the semiconductor structure.

As shown in FIG. 29-FIG. 44, another embodiment of the disclosure provides a semiconductor structure. The semiconductor structure is substantially same as the semiconductor structure in the aforementioned embodiments. The main difference lies in that orthographic projections of the plurality of leading wire posts 5 of the semiconductor structure on the surface of the substrate are at least partially overlapped with orthographic projections of the horizontal signal lines 3 on the surface of the substrate. Parts of the semiconductor structure same as or similar to the semiconductor structure in the aforementioned embodiments refer to detailed description in the aforementioned embodiments, which is not elaborated herein.

The semiconductor structure includes: a substrate (not shown in the drawings), on which a stacked structure is provided, and the stacked structure includes a plurality of memory cell groups TC0 arranged in the first direction X, and each of the memory cell groups TC0 includes multiple layers of memory cells TC arranged in the second direction Z, and the stacked structure further includes a plurality of horizontal signal lines 3 arranged in the second direction Z, and each of the horizontal signal lines 3 is contacted with one layer of the memory cells TC; a plurality of leading wire posts 5 arranged in the first direction X and extending along the second direction Z, and orthographic projections of the plurality of leading wire posts 5 on the surface of the substrate are at least partially overlapped with orthographic projections of the horizontal signal lines 3 on the surface of the substrate, and the leading wire posts 5 are connected to the horizontal signal lines 3.

That is, the leading wire posts 5 are directly connected to the horizontal signal lines 3 in an alternative manner by at least utilizing the space positions of part of the horizontal signal lines 3, so that it contributes to reducing the number of staircases or it is no longer to arrange a staircase area independently, thereby improving the integration level of the semiconductor structure.

The semiconductor structure will be described below in detail in combination with the drawings.

Referring to FIG. 29-FIG. 37, the leading wire post 5 is located on the top surface of the horizontal signal line 3 of the corresponding layer, and the bottom surface of the leading wire post 5 is contacted with the top surface of the horizontal signal line 3 of the corresponding layer. In some other embodiments, the bottom of the leading wire post 5 may be embedded into the horizontal signal line 3 of the corresponding layer; alternatively, the bottom of the leading wire post 5 may penetrate through the horizontal signal line 3 of the corresponding layer, that is, the side wall of the leading wire post 5 may also be contacted with the horizontal signal line 3 of the corresponding layer.

Referring to FIG. 29-FIG. 30, FIG. 32, FIG. 34 and FIG. 36, at least one leading wire post 5 penetrates through at least one horizontal signal line 3, that is, at least one of the leading wire posts 5 is connected to the horizontal signal line 3 of the non-top layer. It is to be noted that the leading wire post 5 connected to the horizontal signal line 3 of the non-top layer needs to occupy, besides the space position of the horizontal signal line 3 of the corresponding layer, the space position of the horizontal signal line 3 above the corresponding layer. Therefore, the leading wire post 5 will penetrate through the horizontal signal line 3 located above the corresponding layer. Referring to FIG. 31, with respect to the leading wire post 5 connected to the horizontal signal line 3 of the top layer, the leading wire post 5 does not need to penetrate through the horizontal signal lines 3 out of the corresponding layer.

It is to be noted that the leading wire post 5 penetrates through the horizontal signal line 3 located above the corresponding layer, but the horizontal signal line 3 above the corresponding layer is not truncated completely.

Specifically, referring to FIG. 29-FIG. 44, the horizontal signal line 3 includes a contact region 31 and an exposed region 32 arranged in the third direction Y; the leading wire post 5 is connected to the contact region 31, and the exposed region 32 is exposed; and the third direction Y is perpendicular to the second direction Z and parallel to the surface of the substrate. That is to say, the leading wire post 5 is contacted with the contact region 31 of the horizontal signal line 3 of the corresponding layer and penetrates through the contact region 31 of the horizontal signal line 3 located above the corresponding layer, and the exposed regions 32 of all the horizontal signal lines 3 are exposed. Although the horizontal signal line 3 above the corresponding layer is penetrated, the horizontal signal line 3 will not be completely truncated since the exposed regions 32 are reserved, and the horizontal signal line 3 may still be contacted with the memory cell TC of the same layer.

Figure 32:
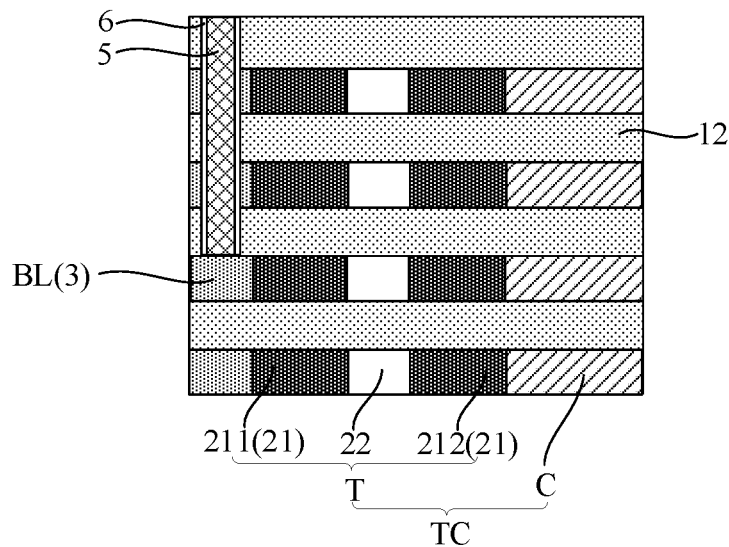
FIG. 32 illustrates another section view of a semiconductor structure provided by another embodiment of the disclosure.
Figure 33:
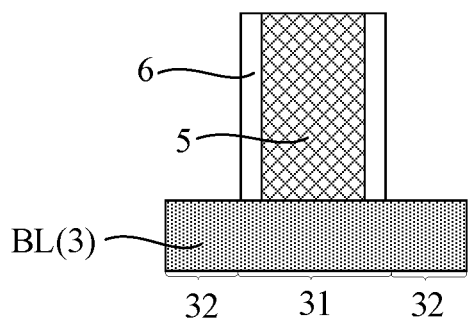
FIG. 33 illustrates a partial enlarged drawing of FIG. 32.

In some embodiments, referring to FIG. 32-FIG. 33, FIG. 33 illustrates a partial enlarged drawing of the horizontal signal line 3 of the corresponding layer and the leading wire post 5 in FIG. 32. The exposed regions 32 are located on two opposite sides of the contact region 31. The orthographic projection of the leading wire post 5 on the surface of the substrate is overlapped with the orthographic projection of the contact region 31 on the surface of the substrate. That is to say, the contact region 31 is located in a center position of the horizontal signal line 3, the leading wire post 5 is connected to the center of the horizontal signal line 3 of the corresponding layer and penetrates through the center of the horizontal signal line 3 located above the corresponding layer, the exposed regions 32 of the horizontal signal line 3 are not truncated, and the horizontal signal line 3 may still be contacted with the memory cells TC of the same layer.

Figure 34:
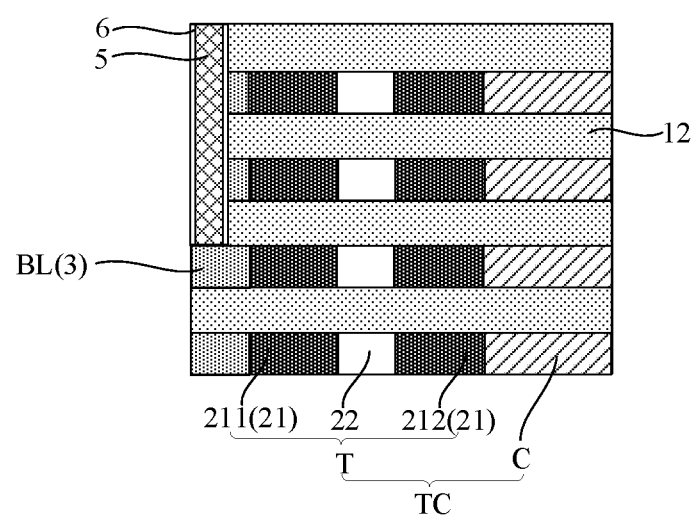
FIG. 34 illustrates another section view of a semiconductor structure provided by another embodiment of the disclosure.
Figure 35:
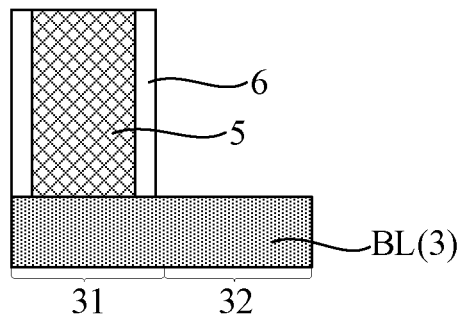
FIG. 35 illustrates a partial enlarged drawing of FIG. 34.
Figure 36:
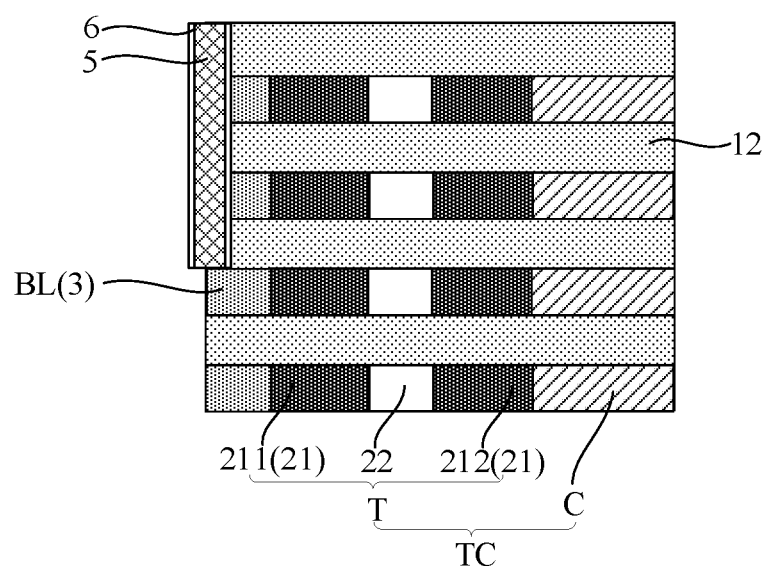
FIG. 36 illustrates another section view of a semiconductor structure provided by another embodiment of the disclosure.
Figure 37:
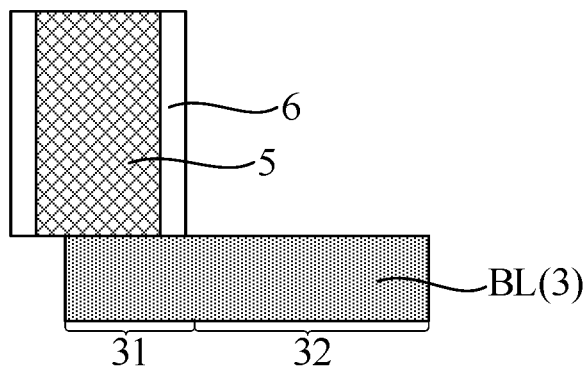
FIG. 37 illustrates a partial enlarged drawing of FIG. 36.
Figure 38:
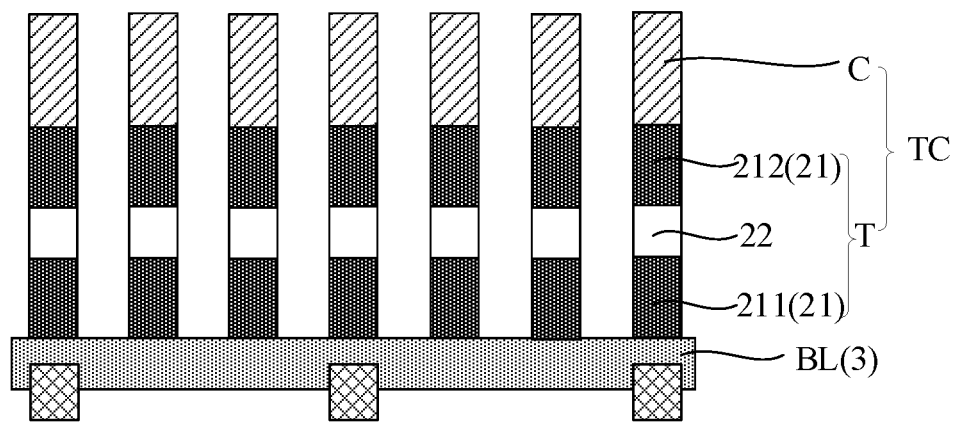
FIG. 38 illustrates a top view of a semiconductor structure provided by another embodiment of the disclosure.

In some other embodiments, referring to FIG. 34-FIG. 38, FIG. 35 illustrates a partial enlarged drawing of the horizontal signal line 3 of the corresponding layer and the leading wire post 5 in FIG. 34, FIG. 37 illustrates a partial enlarged drawing of the horizontal signal line 3 of the corresponding layer and the leading wire post 5 in FIG. 36, and FIG. 38 is a top view of the semiconductor structure shown in FIG. 36. The horizontal signal line 3 has two opposite sides arranged in the third direction Y, the exposed region 32 is located on one of the two opposite sides, and the contact region 31 is located on the other of the two opposite sides. That is, the leading wire post 5 is contacted with one side of the horizontal signal line 3 of the corresponding layer and the other side of the horizontal signal line 3 is exposed, the leading wire post 5 penetrates through one side of the horizontal signal line 3 above the corresponding layer, and the other side of the horizontal signal line 3 above the corresponding layer is not penetrated.

In an example, referring to FIG. 34-FIG. 35, the orthographic projection of the leading wire post 5 on the surface of the substrate is overlapped with the orthographic projection of the exposed region 32 on the surface of the substrate. That is, in the direction parallel to the substrate, the leading wire post 5 utilizes the space position of the horizontal signal line 3 and does not exceed the horizontal signal line 3, so that it contributes to improving the compact degree between the leading wire post 5 and the horizontal signal line 3, so as to improve the space utilization ratio.

In another example, referring to FIG. 36-FIG. 38, the leading wire post 5 is protruded relative to the contact region 31. That is, the leading wire post 5 is protruded relative to one side of the horizontal signal line 3. That is to say, only part of the bottom surface of the leading wire post 5 is in contact connection with the contact region 31. Protruding arrangement may reduce the area of the horizontal signal line 3 above the corresponding layer penetrated by the leading wire post 5, so that the resistance of the horizontal signal line 3 above the corresponding layer is reduced. Meanwhile, it may further guarantee that the leading wire post 5 has a large cross sectional area, so that the resistance of the leading wire post 5 is reduced.

It is to be noted that in some embodiments, the horizontal signal line 3 may be strip-like, that is, the orthographic projection of the horizontal signal line 3 on the surface of the substrate is rectangular. In some other embodiments, the horizontal signal line 3 may include a main body portion and a protrusion portion connected with each other. The main body portion is strip-like, and the protrusion portion may be in shapes such as square or zigzag, that is, the length of the protrusion portion in the first direction X is smaller than the length of the main body portion in the first direction X. The main body portion and the protrusion portion may be arranged in the third direction Y. The main body portion is contacted with the memory cell group TC0, and the protrusion portion is contacted with the leading wire post 5. Exemplarily, the bottom surface of the leading wire post 5 is contacted with the top surface of the protrusion portion of the corresponding layer, and therefore, the leading wire post 5 may not need to penetrate through the main body portion above the corresponding layer, so that it contributes to reducing the resistance of the horizontal signal line 3 above the corresponding layer.

Figure 29:
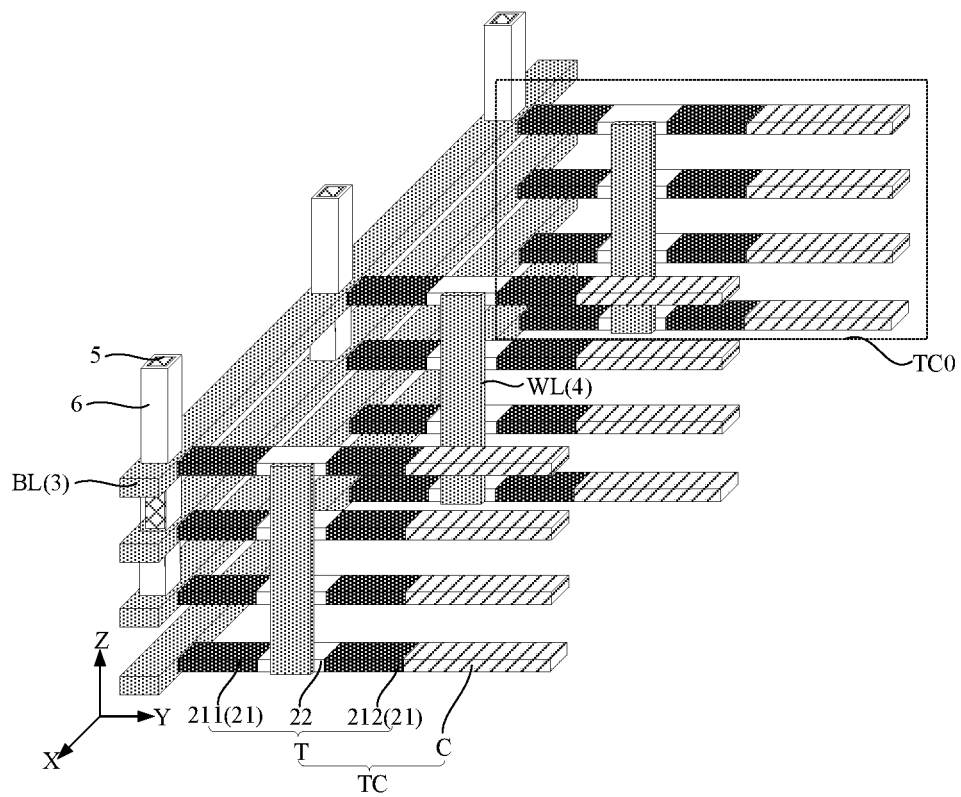
FIG. 29 illustrates a stereogram of a semiconductor structure provided by another embodiment of the disclosure.
Figure 30:
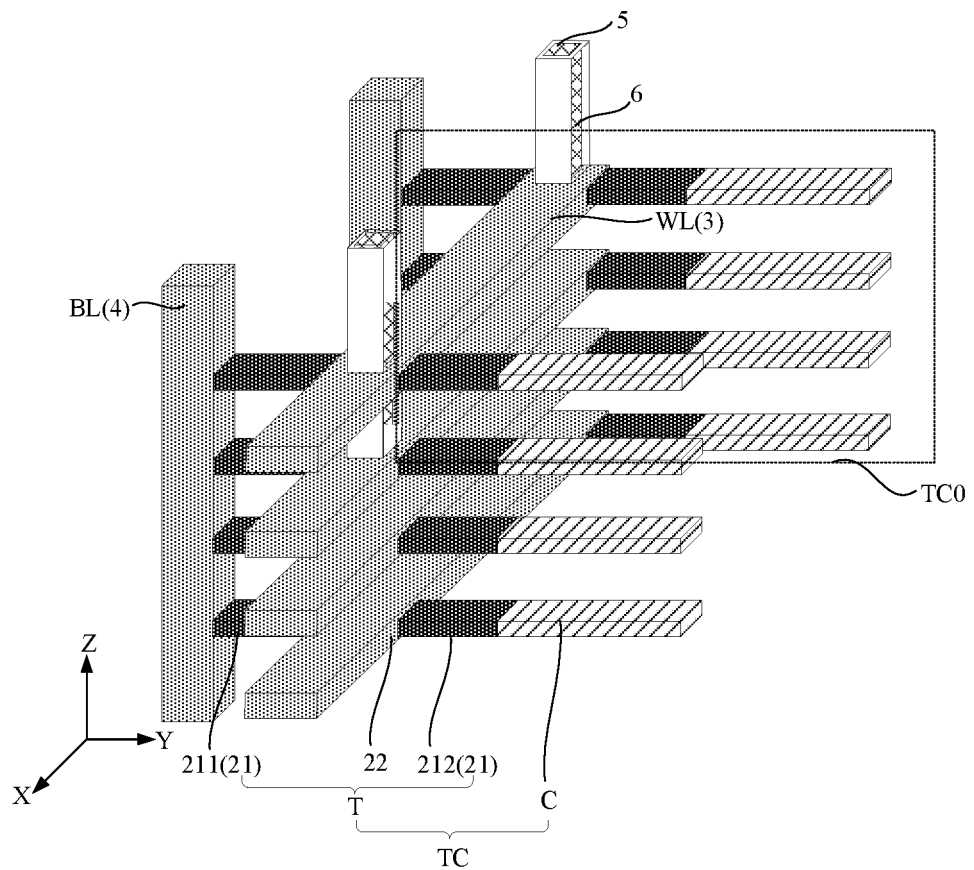
FIG. 30 illustrates a stereogram of another semiconductor structures provided by another embodiment of the disclosure.
Figure 31:
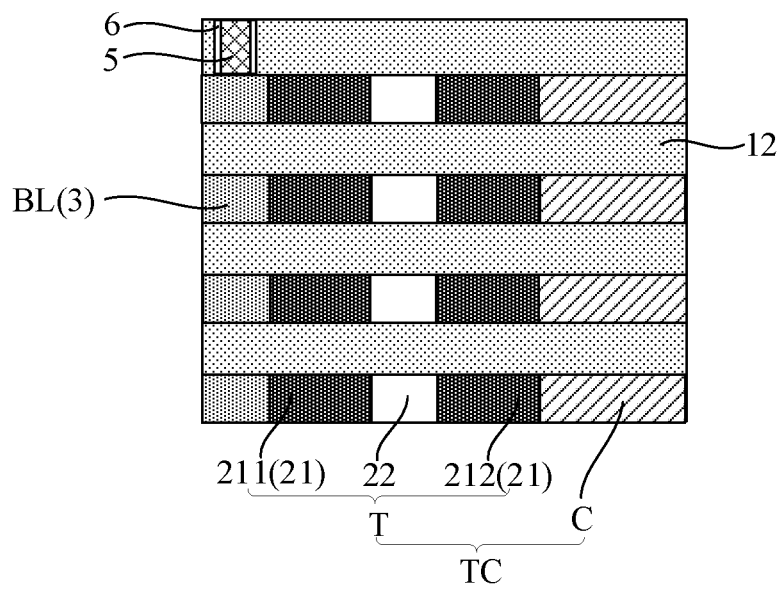
FIG. 31 illustrates a section view of a semiconductor structure provided by another embodiment of the disclosure.

Referring to FIG. 29-FIG. 30, the memory cell TC includes the channel region 22 and source/drain doped regions 21 arranged in the third direction Y, and the source/drain doped regions 21 are located on two sides of the channel region 22. That is, the memory cell TC at least includes the transistor T. In some other embodiments, the memory cell TC may further include the capacitor C, and the transistor T and the capacitor C are arranged in the third direction Y. The source/drain doped regions 21 may include the first source/drain doped region 211 and the second source/drain doped region 212, the first source/drain doped region 211 may be contacted with the BL, and the second source/drain doped region 212 may be located on the side of the channel region 22 away from the first source/drain doped region 211.

The stacked structure also includes perpendicular signal lines 4 extending along the second direction Z and connected to multiple layers of memory cells TC in the same memory cell group TC0. One of the horizontal signal line 3 and the perpendicular signal line 4 is a BL, and the other of the horizontal signal line 3 and the perpendicular signal line 4 is a WL. The BL is contacted with the source/drain doped region 21, and the WL is contacted with the channel region 22.

Position relationships between the horizontal signal lines 3 and the leading wire posts 5 will be described below in detail in two situations: the horizontal signal lines are BLs and the horizontal signal lines are WLs.

In a case that the horizontal signal lines 3 are BLs, the horizontal signal lines 3 and the leading wire posts 5 mainly have the following several position relationships.

Figure 39:
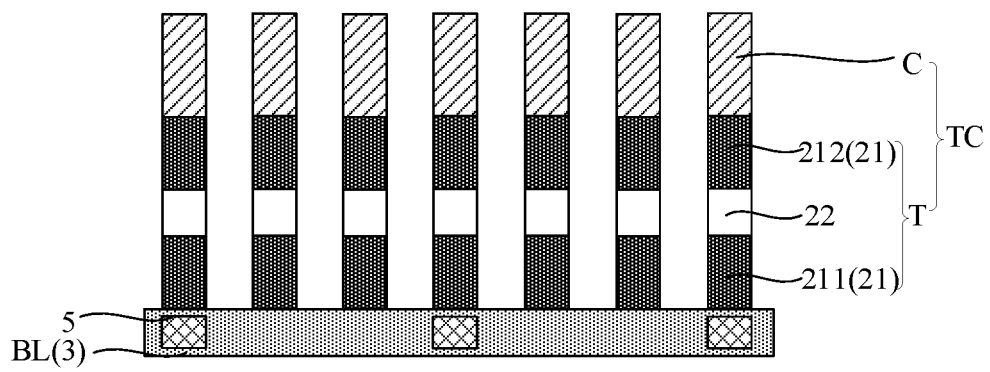
FIG. 39 illustrates another top view of a semiconductor structure provided by another embodiment of the disclosure.

In example 1, referring to FIG. 38-FIG. 39, the leading wire post 5 directly faces the memory cell group TC0 in the third direction Y. Therefore, it contributes to improving the uniformity of position arrangement.

Figure 40:
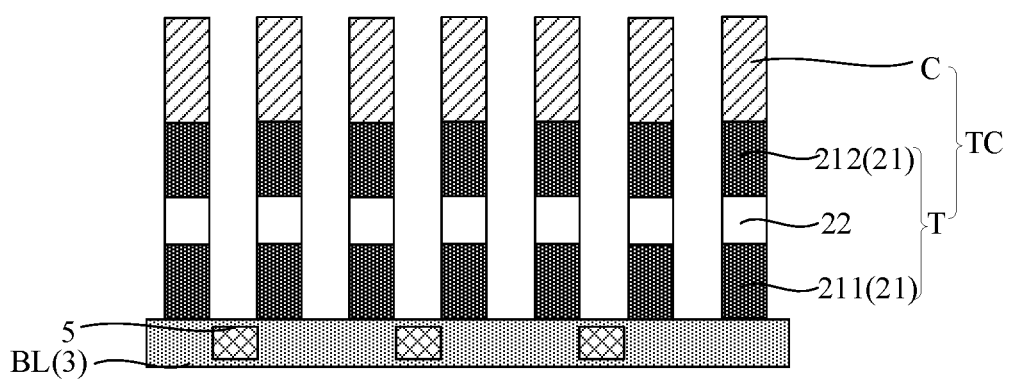
FIG. 40 illustrates another top view of a semiconductor structure provided by another embodiment of the disclosure.

In example 2, referring to FIG. 40, the leading wire posts 5 and the memory cell groups TC are arranged alternatively in the first direction X. That is, the leading wire post may directly face the space between adjacent memory cell groups TC0.

Figure 41:
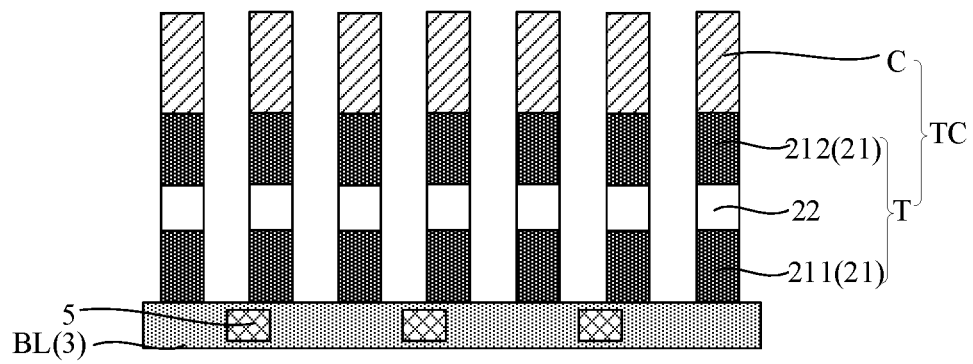
FIG. 41 illustrates another top view of a semiconductor structure provided by another embodiment of the disclosure.

In example 3, referring to FIG. 41, the leading wire post 5 is arranged simultaneously opposite the memory cell group TC0 and the space between the adjacent memory cell groups TC0.

It is to be noted that in the case that the horizontal signal line 3 is the BL, in order to prevent the leading wire post 5 from cutting off the connection between the horizontal signal line 3 above the corresponding layer and the memory cell TC, the exposed region 32 may be located on the side close to the memory cell TC, and the contact region 31 may be located on the side away from the memory cell TC; alternatively, the exposed regions 32 may be located on two opposite sides of the contact region 31.

Figure 42:
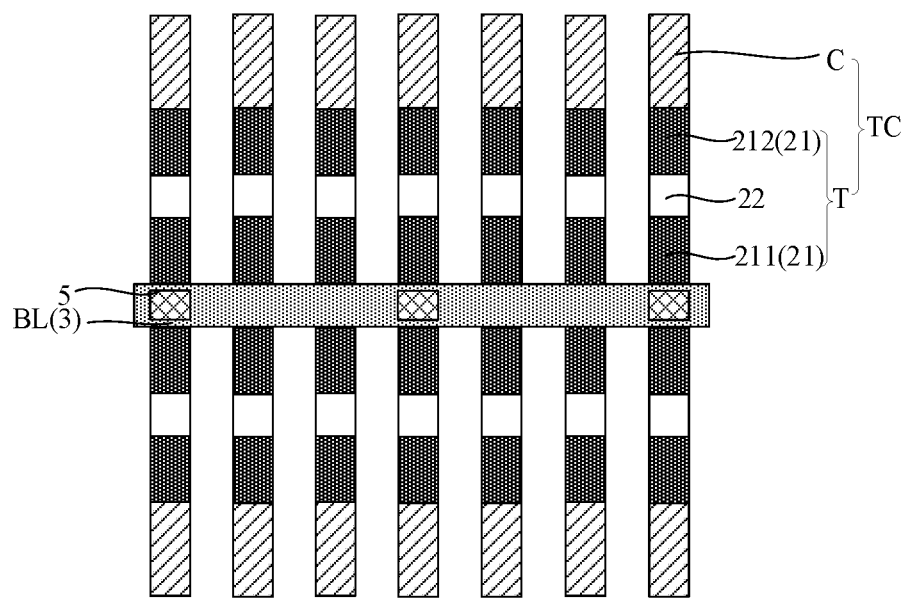
FIG. 42 illustrates another top view of a semiconductor structure provided by another embodiment of the disclosure.

In some embodiment, referring to FIG. 42, there are two memory cells TC in each layer of the memory cell group TC0, and the two memory cells TC are respectively located in two opposite sides of the horizontal signal line 3 arranged in the third direction Y. In such case, one leading wire post 5 leads out more memory cells TC through the horizontal signal line 3, thereby facilitating to improve the integration level of the semiconductor structure.

In a case that the horizontal signal lines 3 are the WLs, the horizontal signal lines 3 and the leading wire posts 5 mainly have the following several position relationships.

Figure 43:
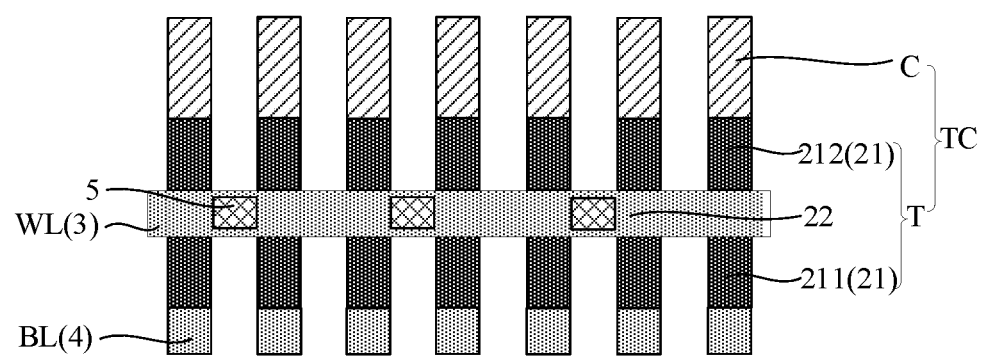
FIG. 43 illustrates another top view of a semiconductor structure provided by another embodiment of the disclosure.

In example 1, referring to FIG. 43, the leading wire post 5 is located between adjacent memory cell groups TC0, that is, the leading wire post 5 and the channel region 22 are staggered, so that the leading wire post 5 may be prevented from truncating the memory cell TC located above the corresponding layer, thereby reducing the number of the invalid memory cells TC.

Figure 44:
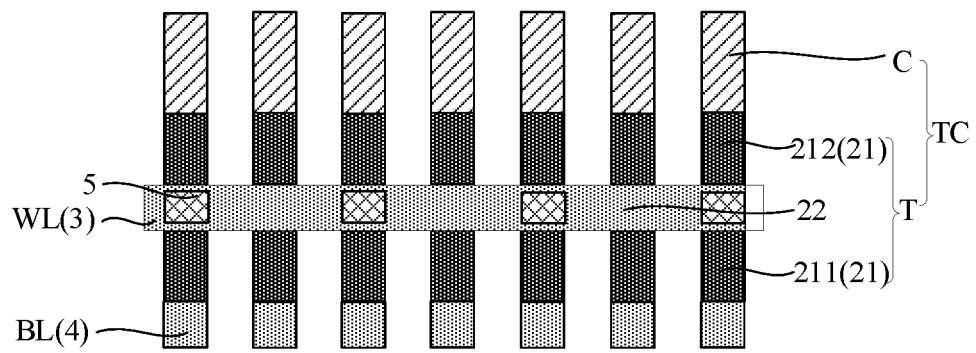
FIG. 44 illustrates another top view of a semiconductor structure provided by another embodiment of the disclosure.

In example 2, referring to FIG. 44, the orthographic projection of the leading wire post 5 on the surface of the substrate is overlapped with the orthographic projection of the channel region 22 on the surface of the substrate. That is, the leading wire post 5 may lead out the horizontal signal line 3 by utilizing the position of the channel region 22, so that it contributes to reducing the spacing between adjacent memory cell groups TC0, so as to improve the compact degree of the memory cell groups TC0, thereby reducing the failure rate of the semiconductor structure.

In another embodiment of the disclosure, edges of the orthographic projection of the leading wire posts 5 on the surface of the substrate and the orthographic projection of the horizontal signal line 3 on the surface of the substrate are overlapped. That is, the leading wire post 5 may be directly connected to the horizontal signal line 3 by utilizing the space of the horizontal signal line 3 itself, and thus the numbers of the connection layers and the staircases may be decreased, thereby improving the integration level of the semiconductor structure.

Figure 45:
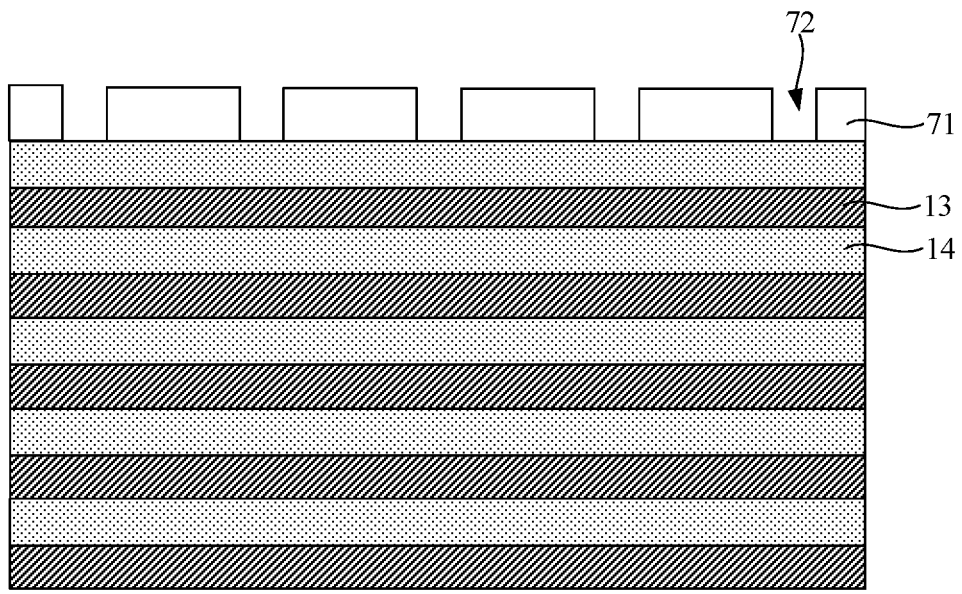
FIG. 45 illustrates a schematic structural diagram corresponding to operations of a method for manufacturing a semiconductor structure provided by another embodiment of the disclosure.
Figure 46:
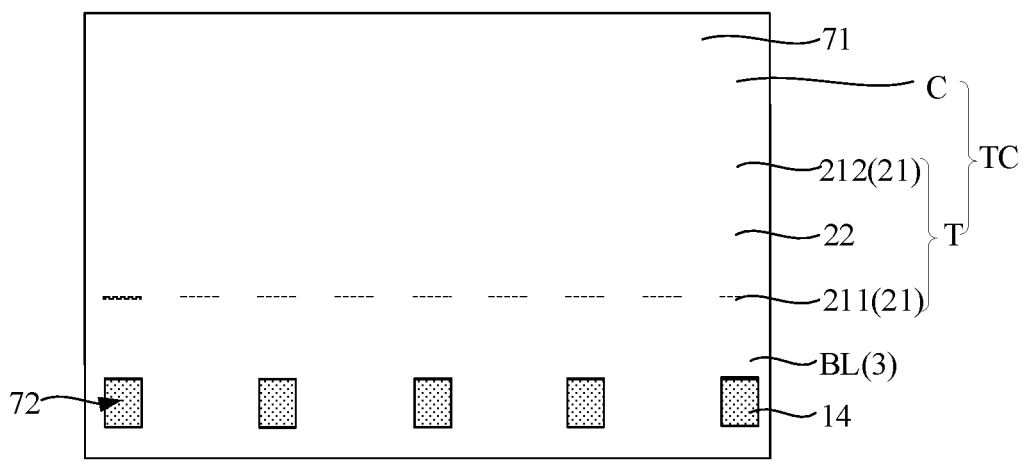
FIG. 46 illustrates another schematic structural diagram corresponding to operations of a method for manufacturing a semiconductor structure provided by another embodiment of the disclosure.

As shown in FIG. 45-FIG. 46, another embodiment of the disclosure provides a method for manufacturing a semiconductor structure. It is to be noted that in order to conveniently describe and clearly illustrate operations of the method for manufacturing a semiconductor structure, FIG. 45-FIG. 56 all are partial schematic structural diagrams of the semiconductor structure. The method for manufacturing a semiconductor structure provided by an embodiment of the disclosure will be described below in detail in combination with the drawings.

A substrate is provided. A stacked structure is formed on the substrate, the stacked structure includes a plurality of memory cell groups TC0 arranged in a first direction X, and each of the memory cell groups TC0 includes multiple layers of memory cells TC arranged in a second direction Z. The stacked structure further includes a plurality of horizontal signal lines 3 arranged in the second direction Z, and each of the horizontal signal lines 3 is contacted with one layer of the memory cells TC.

Exemplarily, the memory cell TC may include the transistor T and the capacitor C. Specifically, the operation of forming the transistor T may include the following operations. Multiple spaced active layers are formed, and each of the active layers includes a plurality of active structures. The active structure is doped, so as to form the source/drain doped regions 21 and the channel region 22. A gate dielectric layer 6 is formed on the surface of the channel region 22. That is to say, the memory cell TC includes the channel region 22 and the source/drain doped regions 21 arranged in the third direction Y, and the source/drain doped regions 21 are located on two sides of the channel region 22; and the third direction Y is parallel to the surface of the substrate. In addition, it is necessary to form the insulating layer 12 between the transistors T of adjacent layers, so as to isolate the adjacent transistors T. The operation of forming the capacitor C may include the following operations. A capacitor supporting layer and a capacitor hole located in the capacitor supporting layer are formed. A lower electrode is formed on the inner wall of the capacitor hole, a capacitor dielectric layer 6 is formed on the surface of the lower electrode, and an upper electrode is formed on the surface of the capacitor dielectric layer 6. The lower electrode, the capacitor dielectric layer 6 and the upper electrode form the capacitor C.

A plurality of leading wire posts 5 arranged in the first direction X are formed. The plurality of leading wire posts 5 and the plurality of horizontal signal lines are arranged along the third direction Y, and the leading wire posts 5 are connected to the horizontal signal lines 3.

The method for forming the leading wire post 5 will be described below in detail.

It is to be noted first that the plurality of horizontal signal lines 3 include the first to $N^{th}$ horizontal signal lines successively arranged in the second direction Z, N being a positive integer greater than 1. The first horizontal signal line is located in the top layer, and the $N^{th}$ horizontal signal line is located in the bottom layer.

Referring to FIG. 45-FIG. 56, the through hole 8 is formed. The through hole 8 includes the first through hole to the $N^{th}$ through hole, a side wall of the first horizontal signal line is exposed by the first through hole, and side walls of the first horizontal signal line to the $N^{th}$ horizontal signal line are exposed by the $N^{th}$ through hole.

Taking the horizontal signal line 3 being a BL as an example, the operations of forming the through hole 8 will be described in detail.

Referring to FIG. 45-FIG. 46, an isolation structure is formed on the side wall of the horizontal signal line 3. In some embodiments, the isolation structure may include an etching barrier layer 13 and an isolation layer 14 arranged alternately. The isolation layer 14 and the horizontal signal line 3 are arranged in the same layer, and the etching barrier layer 13 is arranged directly opposite the insulating layer 12 between the adjacent horizontal signal lines 3 (referring to FIG. 10). In some other embodiments, the isolation structure may only include the isolation layer 14, and the isolation layer 14 covers the side walls of the horizontal signal line 3 and the insulating layer 12.

Continuously referring to FIG. 45-FIG. 46, a mask layer 71 is formed. The mask layer 71 has N openings 72, N being a positive integer greater than 1. The openings 72 are located on one side of the horizontal signal line 3. Exemplarily, the mask layer 71 may be a photoresist layer, and the photoresist layer is photoetched to form the openings 72. Alternatively, the mask layer 71 may be a hard mask layer 71 and a photoresist layer arranged in a stacked manner, and after the photoresist layer is photoetched, the hard mask layer 71 is etched, so as to form the openings 72.

Figure 47:
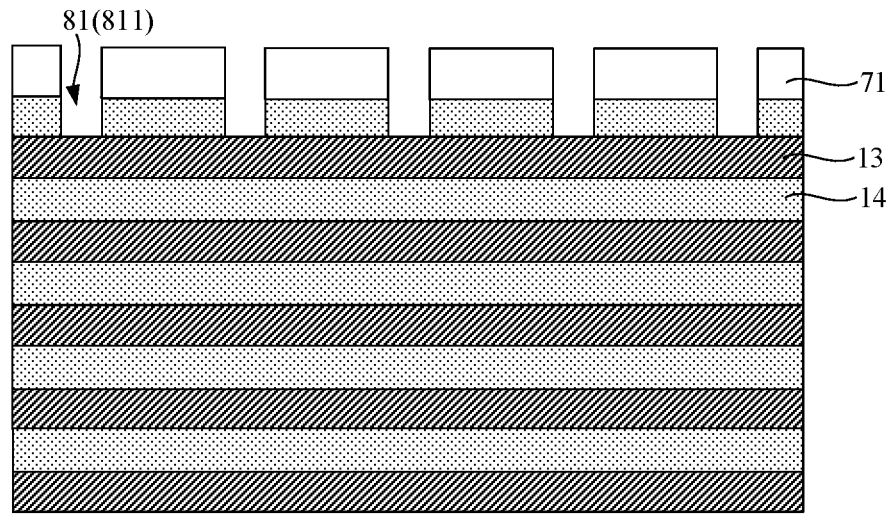
FIG. 47 illustrates another schematic structural diagram corresponding to operations of a method for manufacturing a semiconductor structure provided by another embodiment of the disclosure.
Figure 48:
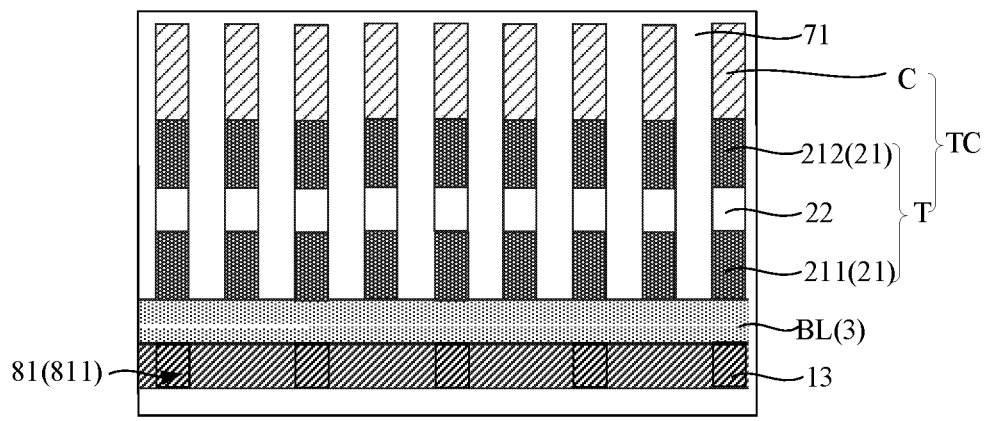
FIG. 48 illustrates another schematic structural diagram corresponding to operations of a method for manufacturing a semiconductor structure provided by another embodiment of the disclosure.

Referring to FIG. 47-FIG. 48, the isolation layer 14 of the top layer is etched along the openings 72 until the etching barrier layer 13 of the top layer is exposed, so as to form a plurality of first sub-through holes 811. The first sub-through holes 811 expose side walls of the first horizontal signal line, and one of the first sub-through holes 811 serves as the first through hole 81.

Figure 49:
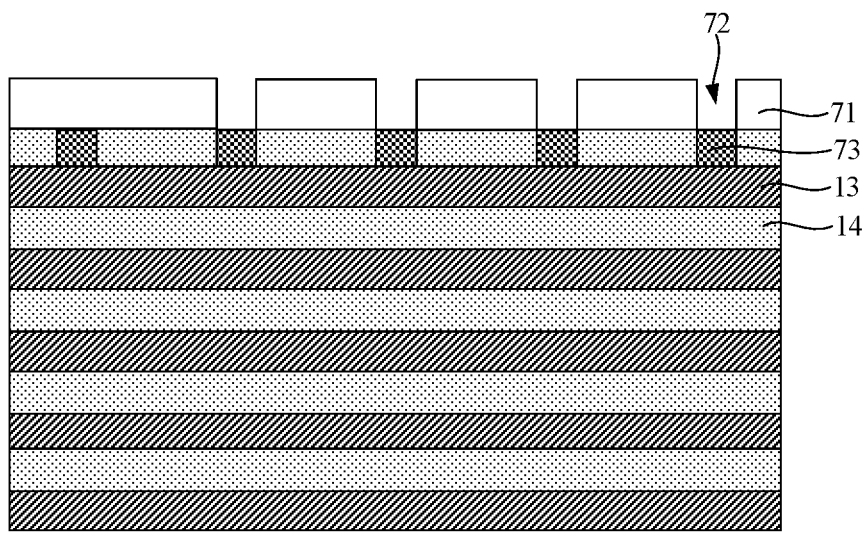
FIG. 49 illustrates another schematic structural diagram corresponding to operations of a method for manufacturing a semiconductor structure provided by another embodiment of the disclosure.
Figure 50:
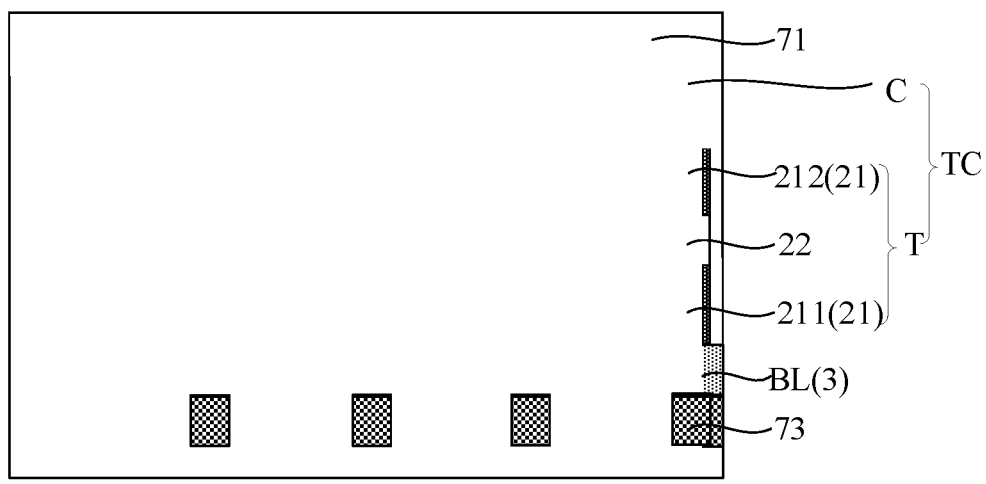
FIG. 50 illustrates another schematic structural diagram corresponding to operations of a method for manufacturing a semiconductor structure provided by another embodiment of the disclosure.

Referring to FIG. 49-FIG. 50, a sacrificial layer 73 filling the first sub-through holes 811 is formed. Exemplarily, a material with a low dielectric constant, such as silicon oxide, is deposited in the first sub-through holes 811 to serve as the sacrificial layer 73.

Continuously referring to FIG. 49-FIG. 50, the mask layer 71 is patterned to enable the mask layer 71 to have (N−1) openings 72. Specifically, the photoresist layer may be spin-coated again and photoetched, to form the openings 72.

Figure 51:
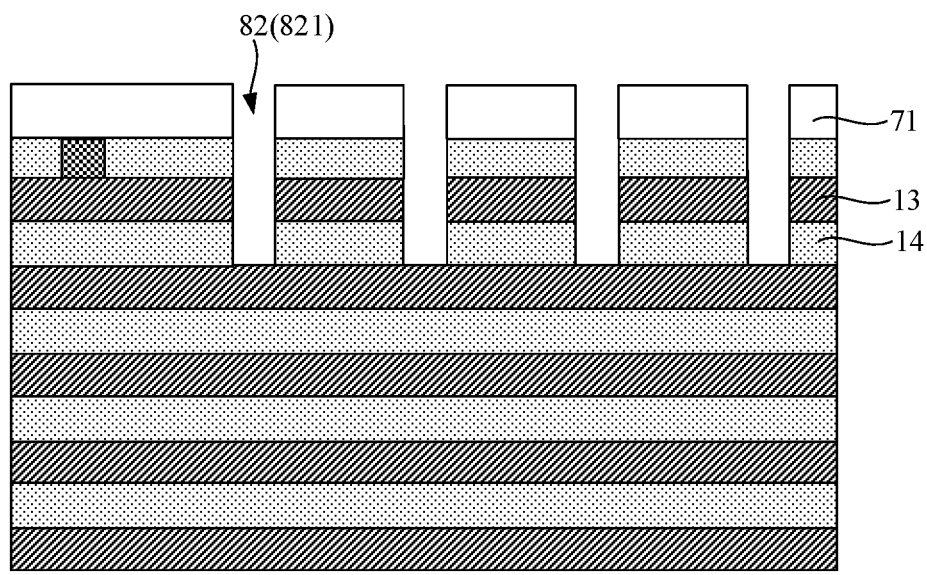
FIG. 51 illustrates another schematic structural diagram corresponding to operations of a method for manufacturing a semiconductor structure provided by another embodiment of the disclosure.
Figure 52:
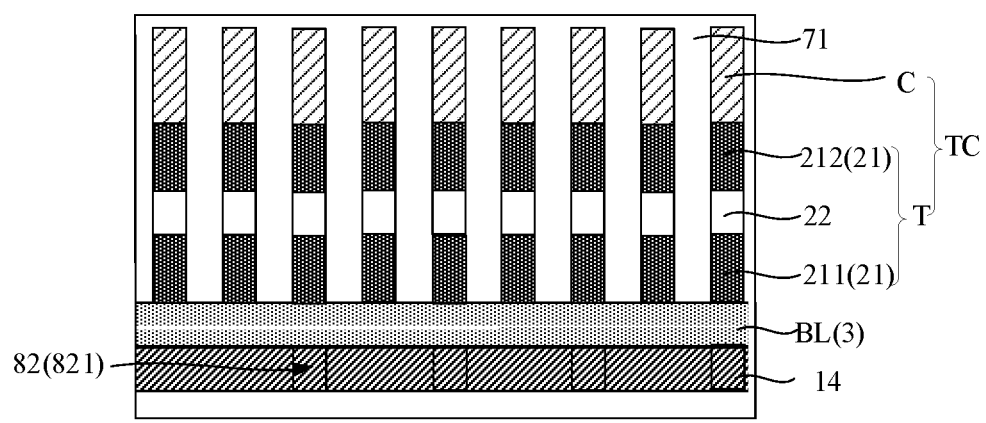
FIG. 52 illustrates another schematic structural diagram corresponding to operations of a method for manufacturing a semiconductor structure provided by another embodiment of the disclosure.

Referring to FIG. 51-FIG. 52, the sacrificial layer 73 and the isolation layer 14 of the second layer are etched along the openings 72 to form (N−1) second sub-through holes 821. One of the second sub-through holes 821 serves as a second through hole 82.

Figure 53:
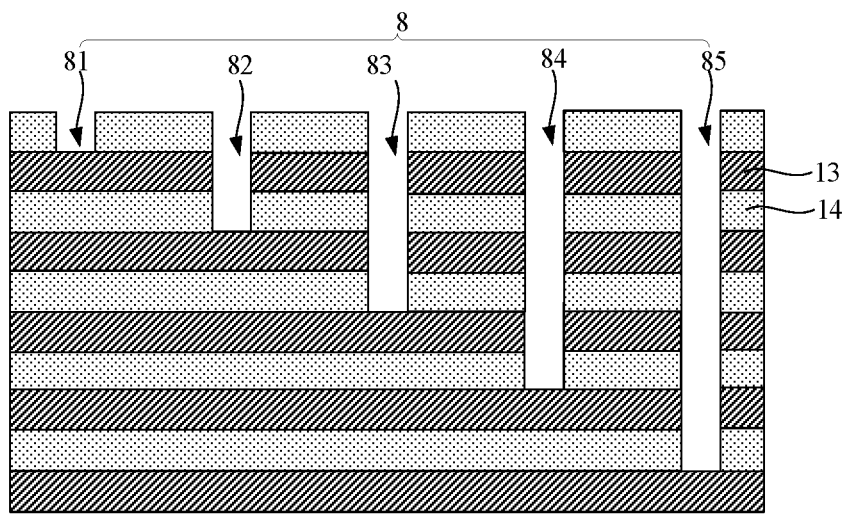
FIG. 53 illustrates another schematic structural diagram corresponding to operations of a method for manufacturing a semiconductor structure provided by another embodiment of the disclosure.
Figure 54:
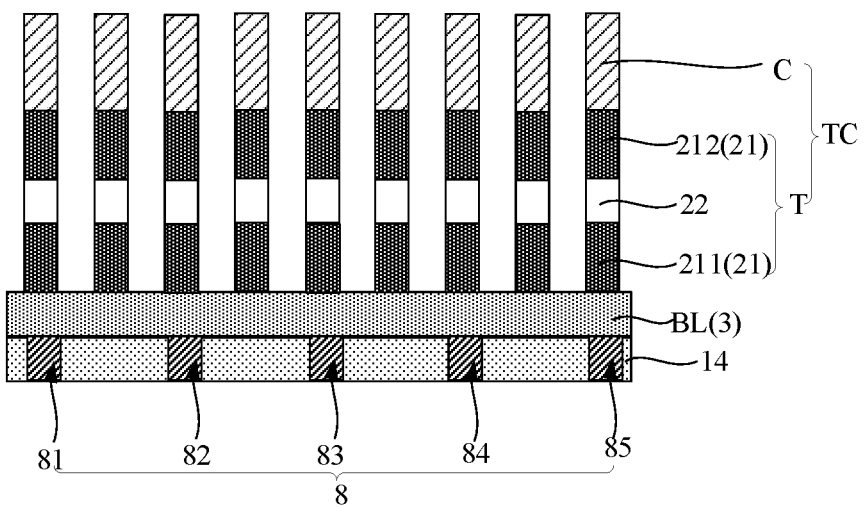
FIG. 54 illustrates another schematic structural diagram corresponding to operations of a method for manufacturing a semiconductor structure provided by another embodiment of the disclosure.

Referring to FIG. 53-FIG. 54, the operations of forming the sacrificial layer 73, patterning the mask layer 71 and etching are repeated until the side wall of the $N^{th}$ horizontal signal line 3 is exposed, that is, the top surface of the $N^{th}$ etching barrier layer is exposed.

Based on FIG. 49-FIG. 54, the through holes 8 may be formed, and the through holes 8 include the first through hole 8 to the $N^{th}$ through hole 8. Exemplarily, referring to FIG. 53-FIG. 54, the first through hole 81, the second through hole 82, the third through hole 84, the fourth through hole 84 and the fifth through hole 85 may be formed. It is to be noted that in the first direction X, depths of the first through hole 81, the second through hole 82, the third through hole 83, the fourth through hole 84 and the fifth through hole 85 successively arranged are increased in sequence. In other embodiments, in the first direction X, depths of the first through hole 81, the second through hole 82, the third through hole 83, the fourth through hole 84 and the fifth through hole 85 successively arranged may not be progressively increased or decreased, but the through holes are formed alternatively in depth, so as to avoid too large parasitic capacitance between the leading wire posts 5 with large depths among the subsequently formed leading wire posts 5.

It is to be noted that in a case that the horizontal signal line 3 is the WL, the operations of forming the through holes 8 are similar to the aforementioned operations, and the main difference lies in that the insulating layer 12 between the adjacent memory cell groups TC0 is etched to form the through holes 8. Other operations about forming the mask layer 71 and the sacrificial layer 73 may refer to the above detailed description.

Figure 55:
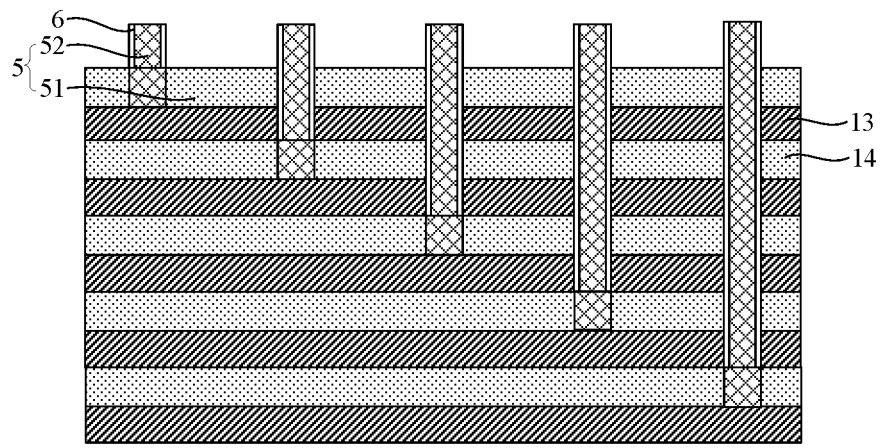
FIG. 55 illustrates another schematic structural diagram corresponding to operations of a method for manufacturing a semiconductor structure provided by another embodiment of the disclosure.
Figure 56:
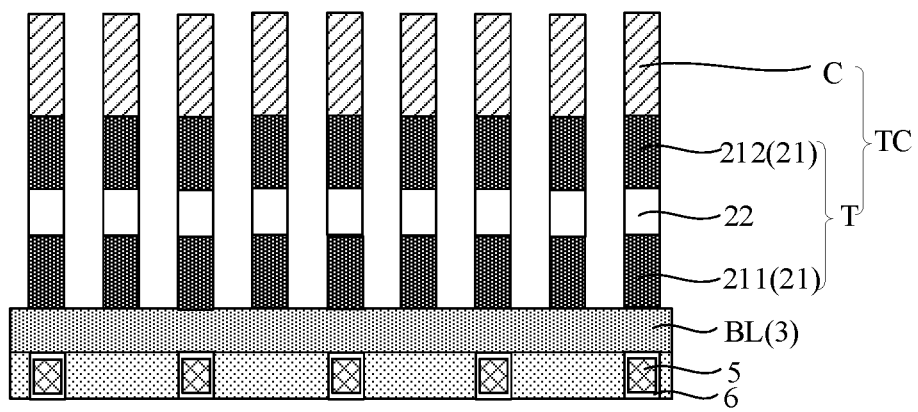
FIG. 56 illustrates another schematic structural diagram corresponding to operations of a method for manufacturing a semiconductor structure provided by another embodiment of the disclosure.

Referring to FIG. 55-FIG. 56, the first contact portion to the $N^{th}$ contact portion are respectively formed at the bottoms of the first through hole 81 to the $N^{th}$ through hole, the first contact portion to the $N^{th}$ contact portion are respectively arranged in the same layers as the first horizontal signal line to the $N^{th}$ horizontal signal line 3, and the contact portion 51 covers the side wall of the first horizontal signal 3 of the corresponding layer.

Continuously referring to FIG. 55-FIG. 56, after the contact portion 51 is formed, the dielectric layer 6 is formed on the side wall of the through hole 8. Exemplarily, an initial dielectric layer is formed on the side wall of the through hole 8 and the surface of the contact portion 51 through a chemical vapor deposition process. The initial dielectric layer on the surface of the contact portion 51 is removed, and the initial dielectric layer located on the side wall of the through hole 8 serves as the dielectric layer 6.

Continuously referring to FIG. 55-FIG. 56, an extension portion 52 filling the through hole 8 is formed, and the contact portion 51 and the extension portion 52 form the leading wire post 5. Exemplarily, metals such as copper, aluminum, titanium or tungsten are deposited in the through hole 8 as the leading wire post 5.

It is to be noted that the abovementioned method for forming the leading wire post 5 is merely exemplary description but is not limited thereto. The method for forming the leading wire post 5 may be adjusted according to a specific structure of the leading wire post 5.

As shown in FIG. 57-FIG. 60, another embodiment of the disclosure provides a method for manufacturing a semiconductor structure. The method for manufacturing a semiconductor structure is substantially same as the aforementioned method for manufacturing a semiconductor structure, and same or similar parts refer to detailed description in the aforementioned embodiments. In order to conveniently describe and clearly illustrate operations of the method for manufacturing a semiconductor, FIG. 57-FIG. 60 all are partial schematic structural diagrams of the semiconductor structure. The method for manufacturing a semiconductor structure will be described below in detail in combination with the drawings.

A substrate is provided. A stacked structure is formed on the substrate, the stacked structure includes a plurality of memory cell groups TC0 arranged in a first direction X, and each of the memory cell groups TC0 includes multiple layers of memory cells TC arranged in a second direction Z. The stacked structure further includes a plurality of horizontal signal lines 3 arranged in the second direction Z, and each of the horizontal signal lines 3 is contacted with one layer of the memory cells TC.

The method about forming the stacked structure may refer to detailed description of the aforementioned embodiments.

Referring to FIG. 57-FIG. 60, the plurality of leading wire posts 5 arranged in the first direction and X and extending along the second direction Z are formed. Orthographic projections of the plurality of leading wire posts 5 on the surface of the substrate are at least partially overlapped with orthographic projections of the horizontal signal lines 3 on the surface of the substrate, and the leading wire posts 5 are connected to the horizontal signal lines 3.

The method for manufacturing the leading wire posts 5 will be described below in detail.

It is to be noted first that the plurality of horizontal signal lines 3 include the first to $N^{th}$ horizontal signal lines successively arranged in the second direction Z, N being a positive integer greater than 1. The first horizontal signal line is located in the top layer, and the $N^{th}$ horizontal signal line is located in the bottom layer.

Figure 57:
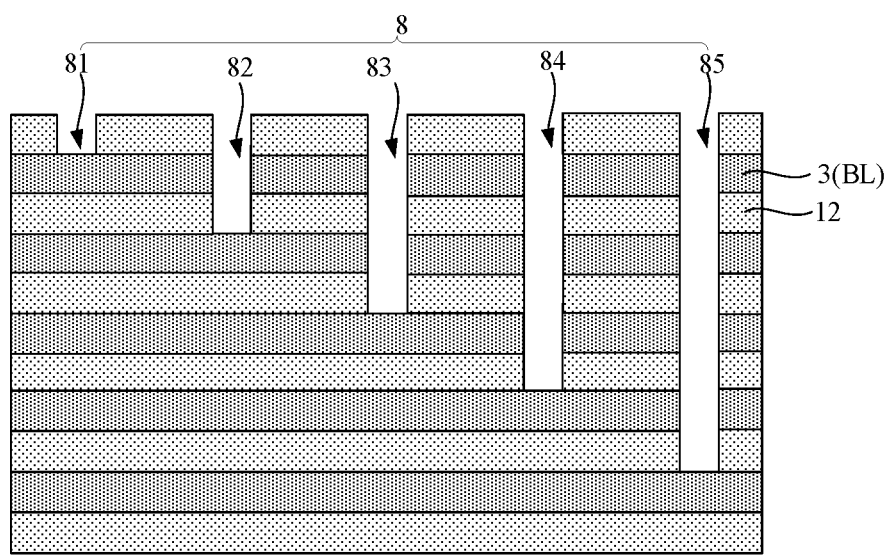
FIG. 57 illustrates a schematic structural diagram corresponding to operations of a method for manufacturing a semiconductor structure provided by another embodiment of the disclosure.
Figure 58:
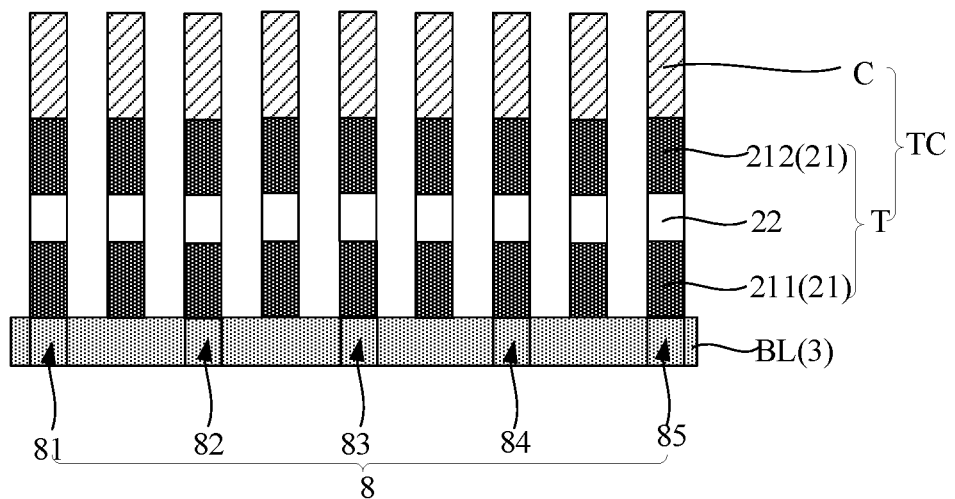
FIG. 58 illustrates another schematic structural diagrams corresponding to operations of a method for manufacturing a semiconductor structure provided by another embodiment of the disclosure.

Referring to FIG. 57-FIG. 58, the through holes 8 are formed, and the through holes 8 include the first through hole 81 to the $N^{th}$ through hole. The top surface of the first horizontal signal line is exposed by the first through hole 81; the $N^{th}$ through hole penetrates through the first horizontal signal line to the $(N-1)^{th}$ horizontal signal line, and exposes the top surface of the $N^{th}$ horizontal signal line.

The operations of forming the through hole 8 are substantially same as the operations in the aforementioned embodiments, and the main difference lies in that the through hole 8 penetrates through one or more horizontal signal lines 3, and therefore, it is necessary to etch the one or more horizontal signal lines 3. In addition, in a case that the leading wire post 5 utilizes the position of the memory cell group TC0, it is further necessary to etch the channel region 22 and the insulating layer 12 located between memory cells TC of the upper layer and memory cells TC of the lower layer when the through hole 8 is formed; and in a case that the leading wire post 5 utilizes the position between the adjacent memory cell groups TC0, it is further necessary to etch the insulating layer 12 between adjacent memory cells TC when the through hole 8 is formed. Other operations about forming the mask layer 71 and the sacrificial layer 73 may refer to detailed description of the aforementioned embodiments.

Figure 59:
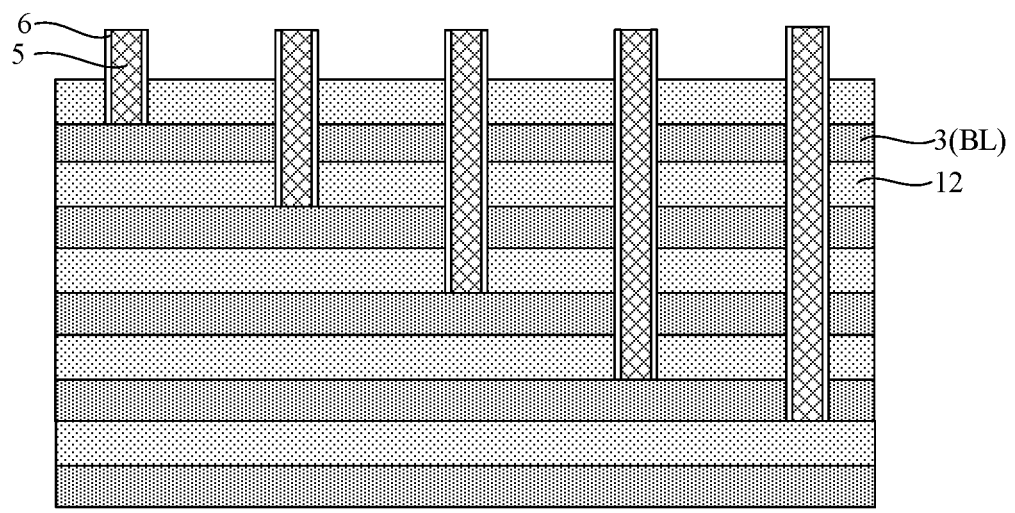
FIG. 59 illustrates another schematic structural diagrams corresponding to operations of a method for manufacturing a semiconductor structure provided by another embodiment of the disclosure.
Figure 60:
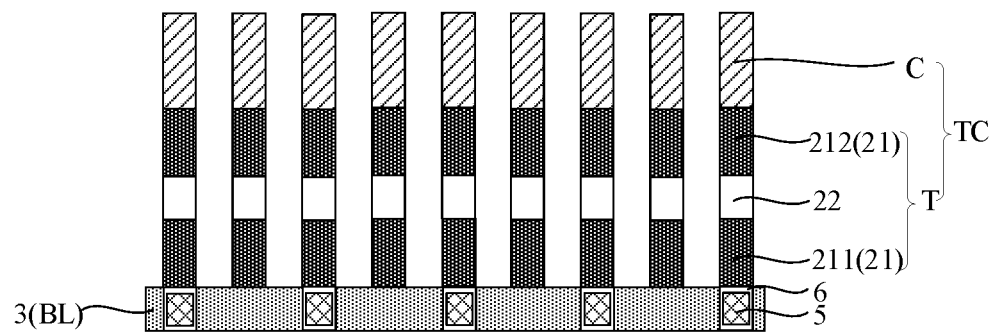
FIG. 60 illustrates another schematic structural diagrams corresponding to operations of a method for manufacturing a semiconductor structure provided by another embodiment of the disclosure.

Referring to FIG. 59-FIG. 60, the dielectric layer 6 is formed on the side wall of the through hole 8. Specifically, an initial dielectric layer is formed on the inner walls of the through hole 8. The initial dielectric layer located on the bottom wall of the through hole 8 is removed to expose the horizontal signal line 3 of the corresponding layer, and the initial dielectric layer located on the side wall of the through hole 8 serves as the dielectric layer 6. The leading wire post 5 filling the through hole 8 is formed, and the bottom surface of the leading wire post 5 is electrically connected to the horizontal signal line 3.

In the embodiments of the disclosure, the horizontal signal line 3 is etched to form the through hole 8, and the dielectric layer 6 and the leading wire post 5 filling the through hole 8 are formed. Therefore, the leading wire post 5 may be electrically connected to the horizontal signal line 3 directly by utilizing the spatial position of the horizontal signal line 3, so that the number of the staircases may be reduced or the independent staircase area is not formed, thereby improving the integration level of the semiconductor structure.

The embodiments of the disclosure further provide a memory chip, including the semiconductor structure provided by the aforementioned embodiments.

The memory chip is a memory part for storing programs and various data information. Exemplarily, the memory chip may be a random access memory chip or a read-only memory chip. For example, the random access memory chip may include a Dynamic Random Access Memory (DRAM) or a Static Random Access Memory (SRAM). The integration level of the aforementioned semiconductor structure is high, which contributes to realizing microminiaturization of the memory chip.

The embodiments of the disclosure further provide an electronic device, including the memory chip provided by the aforementioned embodiments.

Exemplarily, the electronic device may be a device such as a television, a computer, a mobile phone or a tablet computer. The electronic device may include a circuit board and a package structure, and the memory chip may be welded to the circuit board and protected by the package structure. In addition, the electronic device may further include a power supply for providing an operating voltage to the memory chip.

In the description of the specification, the description with reference to the terms "some embodiments", "exemplarily", and the like means that specific features, structures, materials, or features described in combination with the embodiments or examples are included in at least one embodiment or example of the disclosure. In the description, schematic expressions of the terms do not have to mean same embodiments or exemplary embodiments. Furthermore, specific features, structures, materials or characteristics described can be combined in any one or more embodiments or exemplary embodiments in proper manners. In addition, those skilled in the art can integrate or combine, without mutual contradiction, different embodiments or exemplary embodiments and integrate or combine features of different embodiments or exemplary embodiments described in the description.

Although the embodiments of the disclosure have been shown and described above, it can be understood that the embodiments are exemplary and should not be construed as limitation to the disclosure. Those of ordinary skill in the art can make changes, modifications, replacements and variations to the embodiments within the scope of the present disclosure. Any variations or and modifications made followed by claims and description of the disclosure shall fall within the scope of the disclosure.

The invention claimed is:

1. A semiconductor structure, comprising:
   a substrate, on which a stacked structure is provided, wherein
   the stacked structure comprises a plurality of memory cell groups arranged in a first direction, each of the memory cell groups comprising multiple layers of memory cells arranged in a second direction, and the stacked structure further comprises a plurality of horizontal signal lines arranged in the second direction, each of the horizontal signal lines being in contact with one layer of the memory cells; and
   a plurality of leading wire posts arranged in the first direction, wherein the plurality of leading wire posts and the plurality of horizontal signal lines are arranged along a third direction, and the leading wire posts are connected to the horizontal signal lines, and at least one leading wire post is arranged opposite the memory cell group, the space between the adjacent memory cell groups, or opposite both the memory cell group and the space between the adjacent memory cell groups in the third direction.

2. The semiconductor structure according to claim 1, wherein each horizontal signal line is at least connected to one of the leading wire posts, and the plurality of horizontal signal lines are connected to the plurality of leading wire posts in one-to-one correspondence.

3. The semiconductor structure according to claim 1, wherein the leading wire posts connected to different horizontal signal lines are different in length in the second direction, and bottoms of the leading wire posts are contacted with the horizontal signal lines.

4. The semiconductor structure according to claim 1, wherein adjacent leading wire posts are arranged at an equal spacing in the first direction; or,
   a spacing between the adjacent leading wire posts is in proportion to an area of a directly facing region between the adjacent leading wire posts.

5. The semiconductor structure according to claim 1, wherein the stacked structure further comprises: multiple etching barrier layers arranged in the second direction, each etching barrier layer being contacted with a bottom surface of at least one of the leading wire posts; or,
   the stacked structure further comprises: a dielectric layer, at least located on a side wall of a leading wire post facing a horizontal signal line, a lower surface of the dielectric layer being higher than the horizontal signal line connected to the leading wire post.

6. The semiconductor structure according to claim 1, wherein each memory cell comprises a channel region and source/drain doped regions arranged in the third direction, the source/drain doped regions being located on two sides of the channel region.

7. The semiconductor structure according to claim 6, wherein the horizontal signal line is a bit line, the bit line being contacted with the source/drain doped regions.

8. The semiconductor structure according to claim 7, wherein the leading wire post and the memory cell are respectively located on two opposite sides of the horizontal signal line arranged in the third direction.

9. The semiconductor structure according to claim 8, wherein a width of the leading wire post in the first direction is greater than or equal to that of the memory cell group; and/or
   the width of the leading wire post in the first direction is greater than or equal to a spacing between adjacent memory cell groups; and/or
   the width of the leading wire post in the first direction is greater than that of the leading wire post in the third direction; or,
   wherein the leading wire posts and the memory cell groups are directly opposite in the third direction; or the leading wire posts and the memory cell groups are arranged alternatively in the first direction.

10. The semiconductor structure according to claim 7, wherein the leading wire post and the memory cell are located on a same side of the horizontal signal line, and a width of the leading wire post in the third direction is greater than that of the leading wire post in the first direction.

11. The semiconductor structure according to claim 7, wherein horizontal signal lines of two adjacent stacked structures are arranged opposite, a leading wire post is located between horizontal signal lines of the adjacent stacked structures, and horizontal signal lines of the same layers of the adjacent stacked structures are electrically connected through at least one of the leading wire posts.

12. The semiconductor structure according to claim 7, wherein each layer of memory cells in the memory cell group comprises two memory cells, and the two memory cells are respectively located in two opposite sides of the horizontal signal line arranged in the third direction, and wherein
   adjacent leading wire posts are located on different sides of the horizontal signal line; or all the leading wire posts are located on the same side of the horizontal signal line.

13. The semiconductor structure according to claim 6, wherein the horizontal signal line is a word line, the word line being contacted with the channel region, and wherein
adjacent leading wire posts are located on different sides of the horizontal signal line; or
all the leading wire posts are located on the same side of the horizontal signal line.

14. A semiconductor structure, comprising:
a substrate, on which a stacked structure is provided, wherein
the stacked structure comprises a plurality of memory cell groups arranged in a first direction, each of the memory cell groups comprising multiple layers of memory cells arranged in a second direction, and the stacked structure further comprises a plurality of horizontal signal lines arranged in the second direction, each of the horizontal signal lines being in contact with one layer of the memory cells; and
a plurality of leading wire posts arranged in the first direction and extending along the second direction, wherein orthographic projections of the plurality of leading wire posts on a surface of the substrate and orthographic projections of the horizontal signal lines on the surface of the substrate are at least partially overlapped, the leading wire posts are connected to the horizontal signal lines, and at least one leading wire post is arranged opposite the memory cell group, the space between the adjacent memory cell groups, or opposite both the memory cell group and the space between the adjacent memory cell groups in the third direction.

15. The semiconductor structure according to claim 14, wherein at least one of the leading wire posts penetrates through at least one of the horizontal signal lines.

16. The semiconductor structure according to claim 14, wherein each horizontal signal line comprises a contact region and an exposed region arranged in a third direction, a leading wire post is contacted with the contact region, and the third direction is perpendicular to the second direction and parallel to the surface of the substrate; and
wherein the horizontal signal line has two opposite sides arranged in the third direction, the exposed region is located on one side of the two opposite sides, the contact region is located on the other side of the two opposite sides, and the leading wire post is protruded relative to the contact region.

17. The semiconductor structure according to claim 14, wherein each memory cell comprises a channel region and source/drain doped regions arranged in a third direction, the source/drain doped regions being located on two sides of the channel region.

18. The semiconductor structure according to claim 17, wherein the horizontal signal line is a bit line, the bit line being contacted with the source/drain doped regions, and wherein the leading wire posts and the memory cell groups are directly opposite in the third direction, or the leading wire posts and the memory cell groups are arranged alternatively in the first direction; or,
wherein the horizontal signal line is a word line, the word line being contacted with the channel region, and wherein the leading wire post is located between adjacent memory cell groups, or an orthographic projection of the leading wire post on the surface of the substrate is overlapped with an orthographic projection of the channel region on the surface of the substrate.

19. The semiconductor structure according to claim 14, wherein the horizontal signal line has two opposite sides arranged in a third direction, each layer of memory cells in the memory cell group comprises two memory cells, and the two memory cells are respectively located in two opposite sides of the horizontal signal line arranged in the third direction.

20. A method for manufacturing a semiconductor structure, comprising:
providing a substrate;
forming a stacked structure on the substrate, wherein the stacked structure comprises a plurality of memory cell groups arranged in a first direction, each of the memory cell groups comprising multiple layers of memory cells arranged in a second direction, and further comprises a plurality of horizontal signal lines arranged in the second direction, each of the horizontal signal lines being in contact with one layer of the memory cells; and
forming a plurality of leading wire posts arranged in the first direction, wherein the plurality of leading wire posts and the plurality of horizontal signal lines are arranged along a third direction, and the leading wire posts are connected to the horizontal signal lines, and at least one leading wire post is arranged opposite the memory cell group, the space between the adjacent memory cell groups, or opposite both the memory cell group and the space between the adjacent memory cell groups in the third direction.

\* \* \* \* \*